United States Patent
Masuda et al.

(10) Patent No.: US 6,785,477 B1
(45) Date of Patent: Aug. 31, 2004

(54) OPTICAL RECEIVER USING VARIABLE NEGATIVE-CAPACITANCE CIRCUIT

(75) Inventors: Toru Masuda, Kokubunji (JP); Katsuyoshi Washio, Tokorozawa (JP); Taizo Yoshikawa, Tokorozawa (JP); Eiji Ohue, Ome (JP); Kenichi Ohhata, Hachioji (JP)

(73) Assignees: Hitachi, Ltd., Tokyo (JP); Hitachi Device Engineering Co., Ltd., Chiba (JP)

( * ) Notice: Subject to any disclaimer, the term of this patent is extended or adjusted under 35 U.S.C. 154(b) by 0 days.

(21) Appl. No.: 09/646,509
(22) PCT Filed: Mar. 19, 1998
(86) PCT No.: PCT/JP98/01168
§ 371 (c)(1), (2), (4) Date: Sep. 19, 2000
(87) PCT Pub. No.: WO99/48196
PCT Pub. Date: Sep. 23, 1999
(51) Int. Cl.$^7$ ............................................. H04B 10/06
(52) U.S. Cl. ........................ 398/208; 398/202; 398/203; 398/204; 398/207
(58) Field of Search ................................. 398/202, 206, 398/208, 203, 204, 214

(56) References Cited

U.S. PATENT DOCUMENTS 5,031,196 A * 7/1991 Bahlmann et al. .......... 375/340

FOREIGN PATENT DOCUMENTS

JP 7-135489 5/1995

* cited by examiner

Primary Examiner—M. R. Sedighian
(74) Attorney, Agent, or Firm—Mattingly, Stanger & Malur, P.C.

(57) ABSTRACT

A large time constant is caused due to parasitic capacitance at an anode terminal of a photodetector of an optical receiver. Therefore, an optical receiver wherein a variable negative capacitor mainly including an NPN-type transistor operable at high speed is configured and is connected to the input terminal of a preamplifier to which the output of the photodetector is input so that parasitic capacitance caused in the photodetector and due to packaging is equivalently reduced and the fluctuation of parasitic capacitance caused due to manufacturing dispersion is also compensated is provided.

19 Claims, 12 Drawing Sheets

OPTICAL RECEIVER USING VARIABLE NEGATIVE-CAPACITANCE CIRCUIT

BACKGROUND OF THE INVENTION

The present invention relates to an optical receiver of an optical transmission system for transmitting data using an optical signal.

Recently, the realization of an optical transmission system in which a signal can be transmitted at long distance with S/N ratio (ratio of signal power to noise power) maintained at a low price is desired as optical transmission is popularized. Generally, to transmit at long distance with S/N ratio maintained, the level of a received signal is required to be raised.

FIG. 10 shows the representative configuration of an optical transmission system. An optical transmitter 2 is composed of a multiplexer 33 that multiplexes plural parallel signals, a laser driver 32 and a laser diode 30 that converts an electric signal to an optical signal. An optical receiver 1 is composed of a photodetector 11, a preamplifier 13, an automatic gain controllable (AGC) amplifier 15, a clock (CLK) extraction circuit 16, a decision circuit 17, a demultiplexer 18 and a frequency divider 19. It is parasitic capacitance of an anode terminal 101 of the photodetector 11 that is denoted by a reference number 50 and shown by Cin in the optical receiver 1. The optical transmitter 2 and the optical receiver 1 are connected via an optical fiber 10. The photodetector 11 converts an optical signal received from the optical fiber 10 to a current signal and the preamplifier 13 converts the current signal output by the photodetector 11 to a voltage signal. The AGC amplifier 15 controls the gain so that the amplitude of the output voltage is fixed and the clock extraction circuit 16 extracts a clock from the output of the AGC amplifier 15. The decision circuit 17 discriminates a signal output from the AGC amplifier 15 as a digital signal in synchronization with the clock pulse, the demultiplexer 18 demultiplexes the output of the decision circuit 17 into plural parallel signals in synchronization with a clock pulse output from the frequency divider 19 and these plural parallel signals are sent to a signal processor of a subsequent stage. Also, a current signal may be also converted to a voltage signal using a current detection resistor in place of the preamplifier 13.

In the general optical transmission system described above, to raise the level of a received signal, the light emission power of the laser diode 30 of the optical transmitter 2 has only to be increased, however, generally, there is the relation of tradeoff between the power of the laser diode 30 and high speed, when the light emission power is increased, the frequency characteristic of the optical transmitter is deteriorated and it becomes difficult to realize a flat frequency characteristic in a range of frequencies required for the transmission of a signal.

In the optical receiver 1, to raise the level of a received signal, a large voltage signal can be acquired based upon a small current signal by increasing the ratio (transimpedance) of the output voltage of the preamplifier 13 to a current signal or by increasing the value of the current detection resistor for detecting a current signal and converting it to a voltage signal. For another method, a large current signal can be acquired based upon the small power of light by increasing the area of photodetection of the photodetector 11. As the area of photodetection is increased according to this method, packaging is facilitated and the optical receiver can be manufactured at a low price.

However, as in either method, the parasitic capacitance 50 of the photodetector 11 is caused when the photodetector 11 and the preamplifier 13 or the photodetector 11 and the current detection resistor (not shown) used in place of the preamplifier 13 are connected and a time constant determined by the input resistance of the preamplifier 13 or current detection resistance is increased, the bandwidth of the optical receiver 1 is compressed and a flat frequency characteristic is not acquired in a range of frequencies required for the transmission of a signal. That is, there is a problem that in case means for raising the level of a received signal or facilitating packaging is taken, the flatness of the frequency characteristic of the optical receiver is deteriorated and a sufficient bandwidth cannot be secured.

SUMMARY OF THE INVENTION

Conventional type technique for solving such a problem is disclosed in Japanese published unexamined patent application No. Hei 7-135489 for example. It is technique for preventing the flatness of the frequency characteristic of an optical receiver from being deteriorated and securing sufficient bandwidth even if means for raising the level of a received signal or facilitating packaging is adopted by converting current according to an optical signal applied to a photodetector 11 driven at the voltage Vpd of a terminal 102 to voltage by a resistor 14 and compensating parasitic capacitance 50 (Cin) existing in the photodetector 11 using a negative capacitor acquired by a current mirror circuit composed of a capacitor for compensation 43 (C1), an NPN transistor (Q1) and PNP transistors (Q2, Q3) when the converted voltage is applied to a demodulator 20 via the AGC amplifier and an electric signal according to an input optical signal is acquired as shown in FIG. 11. However, the configuration of the circuit disclosed in the technique to concretely realize the negative capacitor has the following problems.

(1) There is the current mirror circuit in which both the NPN transistor (Q1) and the PNP transistors (Q2 and Q3) are used and the PNP transistors (Q2 and Q3) are arranged on a path where the operating speed of the negative capacitor is determined. As well-known, the upper limit of the operating speed of the PNP transistor is lower than that of the NPN transistor and the current mirror circuit is not suitable for high speed operation. Therefore, the upper limit of a frequency for operating the negative capacitor having the circuit configuration shown in FIG. 11 is low. Also, in case high speed PNP transistors are prepared, the increase of the manufacturing cost is a problem.

(2) In the circuit configuration shown in FIG. 11, even if the frequency characteristic of the optical receiver varies because of dispersion in manufacturing the photodetector or circuits and dispersion in parasitic capacitance caused by the packaging of components because the negative capacitor is based upon a fixed value, the variation cannot be compensated.

That is, the optical receiver using the conventional type negative capacitor has problems that the operating speed of the negative capacitor is slow and the frequency characteristic of the optical receiver cannot be optimized by varying a negative capacitance value corresponding to manufacturing dispersion.

The present invention is made to solve the problems. Parasitic capacitance caused in a photodetector and a package is equivalently reduced by configuring a higher-speed variable negative capacitor than the conventional type and the fluctuation of the parasitic capacitance is also compensated. The present invention provides an optical receiver wherein the frequency characteristic is not deteriorated by the variable negative capacitor even if a photodetector having large detection area is adopted, and a current detection resistor having a large resistance value and an amplifier of a first stage to which large resistance is input are used.

According to the invention, difference in quantity between a current signal output from the photodetector and a current signal flowing in a preamplifier or the current detection resistor can be reduced by applying the same AC current as a current signal flowing into one or more parasitic capacitors existing in a process in which a current signal output from the photodetector flows into the preamplifier and the current detection resistor to the preamplifier or the current detection resistor. Also, the loss of a current signal by parasitic capacitance can be reduced by applying the same AC current as a current signal flowing in one or more parasitic capacitors existing in a process in which a current signal flows in a circuit to the parasitic capacitor(s).

Further, even if the parasitic capacitance has dispersion in the manufacturing process of circuits or in the process of packaging components, the quantity of current signals that flow in the preamplifier or the current detection resistor can be regulated because means for regulating the quantity of AC current is provided and the loss of a current signal by parasitic capacitance can be reduced. Hereby, the deterioration of the frequency characteristic of the optical receiver caused because a current signal flows into the parasitic capacitor can be prevented and the optical receiver the frequency characteristic of which is satisfactory can be acquired.

DESCRIPTION OF THE PREFERRED EMBODIMENTS

Figure 1:
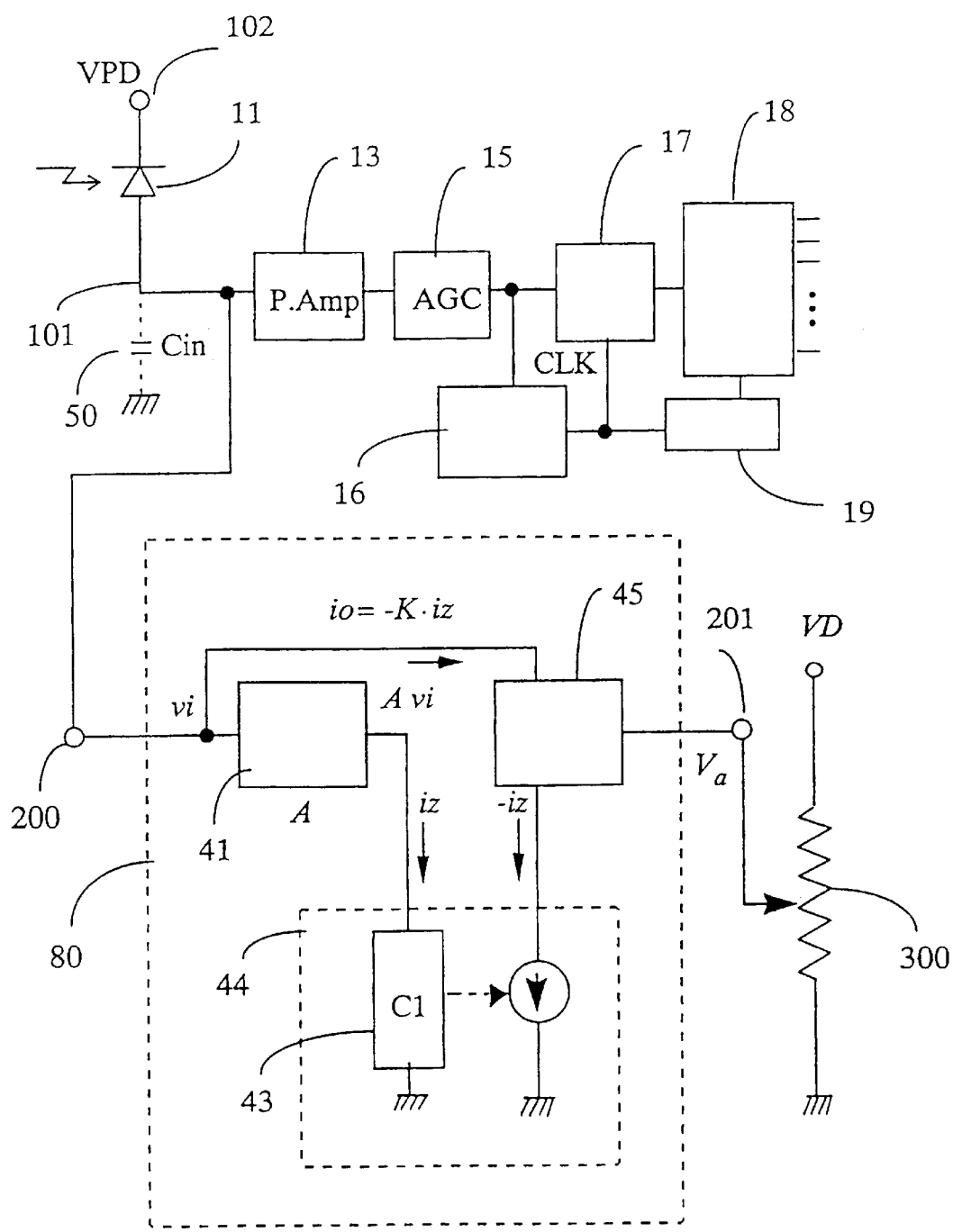
FIG. 1 is a circuit diagram showing a first embodiment of the invention.

Referring to the drawings, embodiments of the invention will be described in detail below.

Embodiment I

FIG. 1 is a circuit diagram showing a first embodiment of an optical receiver according to the invention. The anode terminal 101 of a photodetector 11 driven by voltage Vpd at a terminal 102 is connected to the input terminal of a preamplifier 13. A current signal output by the photodetector 11 according to an applied optical signal is converted to a voltage signal in the preamplifier 13 and is input to a demultiplexer 18 via an AGC amplifier 15 and a decision circuit 17. The demultiplexer 18 demultiplexes an input voltage signal into plural parallel signals and outputs them to a signal processor (not shown) of a subsequent stage. Also, a clock extraction circuit 16 supplies a clock pulse to the decision circuit 17 and further, supplies a clock pulse to the demultiplexer 18 via a frequency divider 19. The input terminal of a variable negative capacitor 80 is connected to the anode terminal 101 of the photodetector 11. In FIG. 1, the input terminal of the variable negative capacitor 80 is denoted by 200.

A parasitic capacitor 50 (Cin) to which the parasitic capacitance of, the photodetector 11, the input capacitance of the preamplifier 13 and pad capacitance are added exists at the anode terminal 101 of the photodetector 11. Also, resistance equivalently shown at the anode terminal 101 is the input resistance Rpre of the preamplifier 13. Therefore, at the anode terminal 101 of the photodetector 11, a time constant in which a pole $fp=1/(2\pi \cdot Cin \cdot Rpre)$ is caused exists. The pole fp denotes a cutoff frequency of a lowpass filter to a current signal output from the photodetector 11. That is, the bandwidth of a current signal input to the preamplifier 13 is limited by the pole fp. The frequency characteristic of the optical receiver is not determined only by the pole of the anode terminal 101 of the photodetector 11, however, generally the pole fp is the pole of the lowest frequency. Therefore, to acquire the satisfactory frequency characteristic of the optical receiver, it is required to raise the value of the pole fp. "$\pi$" denotes the ratio of the circumference of a circle to its diameter and the bandwidth denotes a frequency the gain of which is lower by 3 dB than the value of a frequency in a low area.

However, as the parasitic capacitance 50 (Cin) of the anode terminal 101 of the photodetector is increased when the photodetector having large detection area is used to enhance the sensitivity of the optical receiver system and to facilitate packaging, the pole fp is reduced and the frequency characteristic is deteriorated. In the meantime, when the transimpedance of the preamplifier 13 is increased and the sensitivity of the optical receiver is enhanced, the input resistance Rpre of the preamplifier 13 is increased. Therefore, the pole fp is reduced and the frequency characteristic of the optical receiver is deteriorated.

In this embodiment, the parasitic capacitance 50 is reduced by using the variable negative capacitor 80, the pole fp is raised up to a high frequency and even if means for enhancing the sensitivity of the optical receiver and facilitating packaging is adopted, the optical receiver the frequency characteristic of which is satisfactory can be acquired.

Large impedance is input to the variable negative capacitor 80 and the variable negative capacitor is composed of a voltage amplifier 41 (voltage gain A: A>0) the output voltage of which is in positive correlation with input voltage, a compensating capacitor 43 (C1) to which the output voltage of the voltage amplifier 41 is applied, a current inversion circuit 44 that generates current the phase of which is reverse to current flowing in the compensating capacitor 43 and a current amplifier 45 that varies the value of the output current of the current inversion circuit 44 by voltage applied to a negative capacitance control terminal 201.

If AC voltage applied to the input terminal of the voltage amplifier 41 is vi, AC voltage output from the voltage amplifier 41 is A·vi and AC current iz flows in the compensating capacitor 43. However, A shall be larger than 0.

$$iz = A \cdot vi \cdot (s \cdot C1) \tag{1}$$

In this case, s=2π·f and f denotes a frequency.

When the phase of the output current of the current inversion circuit 44 is reversed, the output current becomes −iz. The current amplifier 45 outputs output current io acquired by multiplying the input current −iz by a conversion factor K. The value of the conversion factor K shall be controlled by voltage Va applied to the negative capacitance control terminal 201. The voltage Va can be controlled by an arbitrary method, however, an example depending upon a potentiometer 300 connected to the driving power source VD of a suitable circuit is shown below.

The output current io of the current amplifier 45 is acquired by the following expression (2).

$$i_0 = K(-iz) = -K \cdot A \cdot (s \cdot C1) \tag{2}$$

As large impedance is input to the voltage amplifier 41, the inflow of current is small and can be ignored. Therefore, impedance zin in case the variable negative capacitor 80 is viewed from the anode terminal 101 of the photodetector 11 is determined based upon AC voltage vi and the output current io of the current amplifier 45 as in the next expression.

$$zin = \frac{vi}{i_0} = \frac{-1}{s \cdot C1 \cdot K \cdot A} \tag{3}$$

As clear from the expression, zin has negative polarity for the compensating capacitor 43 and is varied by the gain A (A>0) of the voltage amplifier 41 and the conversion factor K (K>0) of the current amplifier 45. When arbitrary zin is set, means by which the satisfactory frequency characteristic of the negative capacitor is acquired can be used of the gain A and the conversion factor K.

In case the variable negative capacitor 80 in this embodiment is used, the value of the parasitic capacitance 50 (Cin) of the anode terminal 101 of the photodetector 11 shown in FIG. 1 can be reduced up to Cin' as shown in the next expression (4).

$$Cin' = (Cin - C1 \cdot K \cdot A) \tag{4}$$

For example, if C1=0.25·Cin, K=1 and A=2, Cin' can be as shown in the next expression (5), $$Cin' = 0.5 \cdot Cin \tag{5}$$

the pole fp' of the anode terminal 101 of the photodetector 11 in case the variable negative capacitor 80 is used can be as shown in the next expression (6) and $$\text{pole } f\ p' = \frac{1}{(2\pi \cdot Cin' \cdot R\ pre)} = 2 \times \text{pole } f\ p \tag{6}$$

the pole fp can be raised up to a frequency higher by twice.

Also, as shown in the expression (6), even if the conversion gain of the preamplifier 13 is increased to enhance the sensitivity of the optical receiver and as a result, input resistance Rpre becomes twice, the frequency characteristic of the optical receiver can be prevented from being deteriorated by adding the variable negative capacitor 80.

Further, even if the values of the parasitic capacitance have dispersion in the process of the manufacture and packaging, the conversion factor K is varied by control voltage Va to regulate the value of the negative capacitor and the pole fp' can be raised up to a target frequency.

As described above, according to the first embodiment, in the optical receiver using the variable negative capacitor 80, the parasitic capacitance of the anode terminal 101 of the photodetector 11 is reduced and the pole fp can be raised up to a high frequency. Therefore, the optical receiver having a broadband can be acquired. Also, in case the bandwidth is the same, a more sensitive optical receiver can be acquired. Further, even if the parasitic capacitance 50 and the input resistance Rpre of the preamplifier 13 vary, the pole of the anode terminal 101 of the photodetector 11 can be set to a target frequency by controlling the conversion factor K and varying the value of the negative capacitor. Therefore, even if dispersion occurs in the manufacture of the photodetector and the circuit and parasitic capacitance by packaging, the optical receiver the frequency characteristic of which is satisfactory can be acquired.

Also, in case the preamplifier 13 is replaced with a current detection resistor in the configuration of the optical receiver, the principle described above can be also applied and the value of the current detection resistor at that time is equivalent to the input resistance Rpre of the preamplifier 13. In case the frequency characteristic of the optical receiver is controlled depending upon the pole fp of the anode terminal 101 of the photodetector 11 even if circuits. composing the optical receiver are except the AGC amplifier 15, the decision circuit 18, the clock extraction circuit 16 and the frequency divider 19, the above principle can be applied.

Embodiment II

Figure 2:
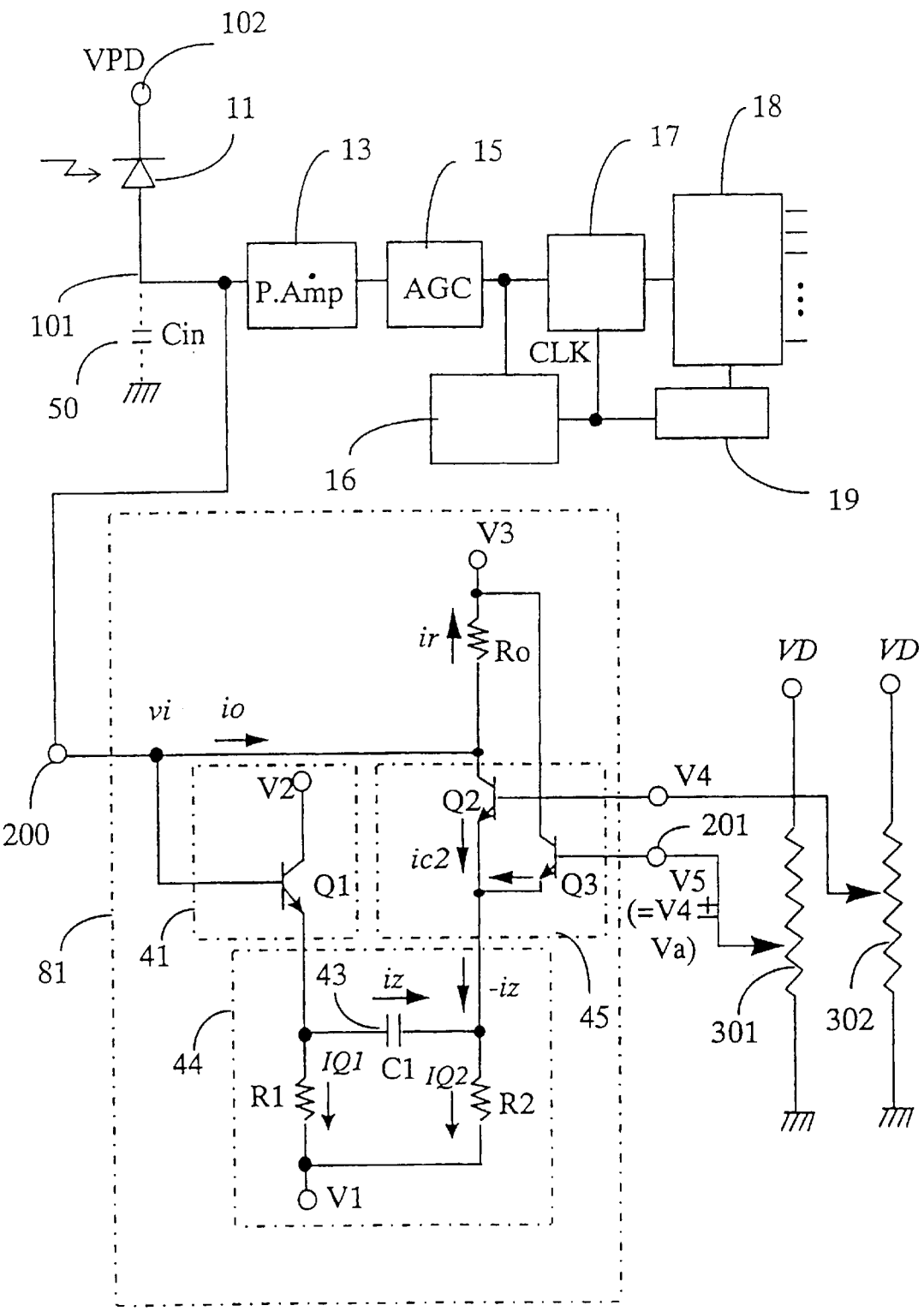
FIG. 2 is a circuit diagram showing a second embodiment of the invention.

FIG. 2 is a circuit diagram showing a second embodiment of the optical receiver according to the invention. Except that the configuration of a variable negative capacitor 81 is different, the configuration is the same as the configuration shown in FIG. 1. The concrete configuration of the variable negative capacitor 81 will be described below.

Large impedance is input to a transistor Q1, the transistor is operated as a voltage amplifier (buffer) 41 having the gain of approximately once, the base is connected to the input terminal of a preamplifier 13, the collector is connected to a terminal V2 at fixed voltage and the emitter is connected to a terminal V1 at fixed voltage via a resistor R1.

The emitters of transistors Q2 and Q3 are connected to a common node and are connected to a terminal V1 at fixed voltage via a resistor R2. The collector of Q2 is connected to a terminal V3 via a resistor Ro that supplies bias current and the collector of Q3 is directly connected to the terminal V3 at fixed voltage. The base of Q2 is connected to a terminal V4 at fixed voltage, the base of Q3 is connected to a terminal V5 at fixed voltage that generates arbitrary voltage Va between the potential and the potential of the base of Q2 and simultaneously, the base of Q3 functions as a negative capacitance value control terminal 201. In the example of FIG. 2, predetermined potential is applied to the terminal V4 at fixed voltage and the terminal V5 at fixed voltage by potentiometers 302 and 301 respectively connected to the driving power source VD of each suitable circuit as in the embodiment shown in FIG. 1.

One terminal of a compensating capacitor 43 (C1) is connected to the emitter of Q1 and the other terminal is connected to a common emitter of Q2 and Q3. Further, the collector of Q2 is connected to the base of Q1 and AC current flowing in the collector of Q2 is fed back to the input terminal of the preamplifier 13.

The transistors Q1, Q2 and Q3 and the resistors R1 and R2 compose a current inversion circuit 44 and current flowing from the collector of Q1 to the emitter flows from the emitters of Q2 and Q3 to the collectors via the compensating capacitor 43. Also, the transistors Q2 and Q3 compose a current amplifier 45 and the quantity of AC current ic2 flowing in the collector of Q2 is regulated by shunting AC current input to the common emitter depending upon difference in potential between the bases of two transistors. IQ1 denotes the value of DC bias current of Q1 determined by R1, IQ2 determined by R2 denotes the total of DC bias current of Q2 and Q3 and DC current shall not flow in the compensating capacitor 43.

As described above, bias is supplied to each transistor Q1, Q2, Q3 from constant voltage sources V1, V2, V3, V4 and V5 and the resistors R1, R2 and Ro. Voltage applied to each transistor shall operate the transistor in an active area.

First, in the configuration described above, the operation of the variable negative capacitor 81 will be concretely described. The mutual conductance of the transistors Q1, Q2 and Q3 shall be respectively gm1, gm2 and gm3. The AC emitter resistance rm1, rm2 and rm3 of each transistor are expressed in the following expressions (7), (8) and (9). In this case, the parasitic emitter resistance of the transistor is ignored. The effect will be described later.

$$re1 = \frac{1}{gm1} \quad (7)$$

$$re2 = \frac{1}{gm2} \quad (8)$$

$$re3 = \frac{1}{gm3} \quad (9)$$

The total z1 of AC impedance existing between the base of Q1 and each base of Q2 and Q3 is expressed by the next expression.

$$z1 = \frac{1}{s \cdot C1} + re1 + \frac{re2 \cdot re3}{re2 + re3} \quad (10)$$

AC voltage vi of the base of Q1 is applied to z1. As the transistor Q1 operates as an emitter follower, Q1 does not limit the operating speed of the variable negative capacitor 81.

Therefore, AC current iz flowing in the compensating capacitor 43 is acquired as follows.

$$iz = \frac{vi}{z1} = \frac{vi}{\frac{1}{s \cdot C1} + re1 + \frac{re2 \cdot re3}{re2 + re3}} \quad (11)$$

"iz" flows from the common emitter of Q2 and Q3 to the collectors of Q2 and Q3. At that time, the phase of iz is reversed, iz is shunted to Q2 and Q3 and flows into them. The ratio K in shunts of the collector AC current ic2 of Q2 to iz is determined depending upon resistance re2 and re3 at respective emitters as follows.

$$K = \frac{re3}{re2 + re3} \quad (12)$$

Therefore, the collector AC current ic2 of Q2 is expressed using iz and emitter resistance by the following expression (13).

$$ic2 = -iz \cdot K = -iz \cdot \frac{re3}{re2 + re3} \quad (13)$$

"re1, re2 and re3" are determined based upon the bias current IQ1 and IQ2 of each transistor and the values of re2 and re3 can be controlled based upon potential difference Va between the respective base terminals of Q2 and Q3. "re1" is expressed by the following expression (14).

$$re1 = \frac{VT}{IQ1} \quad (14)$$

In this case, thermovoltage is expressed as VT ($\approx$26 mV).

"re2 and re3" are respectively expressed as the function of Va by the following expressions (15) and (16).

$$re2 = \frac{VT \cdot \left(1 + e^{\frac{Va}{VT}}\right)}{IQ2} \quad (15)$$

$$re3 = \frac{VT \cdot \left(1 + e^{\frac{-Va}{VT}}\right)}{IQ2} \quad (16)$$

Therefore, the ratio K in the shunts is expressed as the function K (Va) of Va as follows.

$$K(Va) = \frac{1}{\left(1 + e^{\frac{Va}{VT}}\right)} \quad (17)$$

Therefore, ic2 is acquired in the following expression (18).

$$ic2 = -iz \cdot K(Va) \quad (18)$$

The following expression (19) is acquired erasing iz using the expression (11).

$$ic2 = \frac{-vi \cdot K(Va)}{\frac{1}{s \cdot C1} + re1 + \frac{re2 \cdot re3}{re2 + re3}} \quad (19)$$

Also, the following expression (20) is acquired.

$$\frac{re2 \cdot re3}{re2 + re3} = \frac{VT}{IQ2} \quad (20)$$

Then, when "re" is defined as in the following expression, $$re \equiv re1 + \frac{re2 \cdot re3}{re2 + re3} \quad (21)$$

ic2 can be processed as follows.

$$ic2 = \frac{-vi \cdot K(Va)}{\frac{1}{s \cdot C1} + re} \quad (22)$$

The current amplifier 45 composed of Q2 and Q3 shunts AC current input to the common emitter. Therefore, as also clear from the expression (17), the conversion factor K (Va) of the current amplifier 45 varies in the following range.

$$0 \leq K(Va) \leq 1 \quad (23)$$

Also, as the transistors Q2 and Q3 are operated as a common base transistor, the current amplifier 45 does not limit the operating speed of the variable negative capacitor 81.

Next, the input impedance zin of the variable negative capacitor 82 will be acquired. As input AC voltage vi is also applied to the resistor Ro, the current ir is expressed by the following expression (24).

$$ir = \frac{vi}{R_0} \quad (24)$$

Therefore, when current flowing in the base terminal of Q1 is ignored, AC current io flowing into the variable negative capacitor 81 is expressed by the sum of ic2 and ir as follows.

$$i_0 = ic2 + ir \quad (25)$$
$$= \frac{-vi \cdot K(Va)}{\left(\frac{1}{s \cdot C1} + re\right)} + \frac{vi}{R_0}$$

Therefore, the input impedance zin of the variable negative capacitor 81 is determined based upon vi and io as follows.

$$zin = \frac{vi}{i_0} \quad (26)$$
$$= \frac{1}{\frac{1}{R_0} - \frac{K(Va)}{\frac{1}{s \cdot C1} + re}}$$

That is, zin is expressed by parallel connection of Ro and "−(1/s·C1+re)/K (Va)".

When the expression (26) is cleared, the following expression (27) is acquired.

$$zin = R_0 \frac{1 + s \cdot C1 \cdot re}{1 - s \cdot C1 \cdot (R_0 \cdot K(Va) - re)} \quad (27)$$

Therefore, in case K (Va) is varied in a range in which |Ro·K (Va)|>>|re| is met, zin is expressed as follows and $$zin \approx R_0 \frac{1 + s \cdot C1 \cdot re}{1 - s \cdot C1 \cdot R_0 \cdot K(Va)} \quad (28)$$

zin is expressed as the function of a frequency having the pole $$fp1 = \frac{1}{2\pi \cdot C1 \cdot R_0 \cdot K(Va)}$$

and a zero point $$fz1 = \frac{1}{2\pi \cdot C1 \cdot re}.$$

That is, zin is different depending upon the range of the frequency f. That is, in the following expression (29), $$f < \frac{1}{2\pi \cdot C1 \cdot R_0 \cdot K(Va)} \quad (29)$$

zin=R$_0$, in the following expression (30), $$\frac{1}{2\pi \cdot C1 \cdot R0 \cdot K(Va)} < f < \frac{1}{2\pi \cdot C1 \cdot re} \quad (30)$$

$$zin = \frac{1}{s \cdot C1 \cdot K(Va)} \text{ and in the following expression (31),}$$

$$\frac{1}{2\pi \cdot C1 \cdot re} < f \quad (31)$$

$$zin = \frac{-re}{K(Va)}.$$

Therefore, even if the compensating capacitor 43 is used, the area of frequencies at which zin is regarded as negative capacitance is limited.

Figure 12:
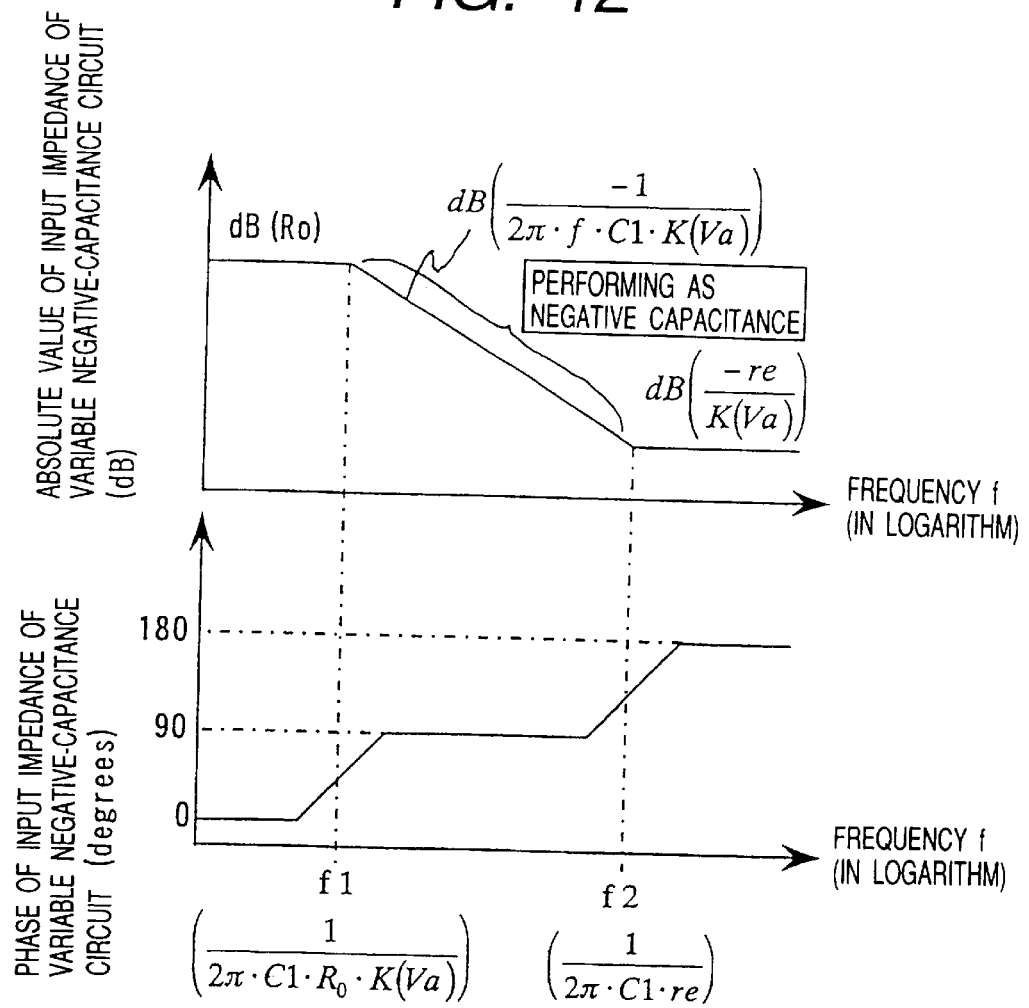
FIG. 12 is an explanatory drawing for explaining the frequency characteristic of the impedance of the variable negative capacitor shown in FIG. 2.

FIG. 12 shows the frequency characteristic of zin of the variable negative capacitor 81. The frequency of AC voltage input to the variable negative capacitor 81 operates as resistance Ro at a low frequency and operates as negative resistance −re/K (Va) at a high frequency. It proves that the range of frequencies in which zin of the variable negative capacitor operates as negative capacitance −C1·K (Va) is determined based upon Ro, K (Va), C1 and re. To realize an ideal negative capacitor, Ro is required to be increased and re is required to be reduced.

The characteristic of the variable negative capacitor 81 in case the parasitic emitter resistance of the transistor is considered will be described below. As the parasitic emitter resistance increases re1, re2 and re3 in the expressions (14) to (16), re is increased. Therefore, it proves that the parasitic emitter resistance is one of causes in which the frequency fz1 of the upper limit for operating as the negative capacitor is lowered and the operating speed of the negative capacitor 81 is deteriorated. However, it is possible to reduce re by regulating the area of the emitter of the transistor and a value of mutual conductance in design.

Next, referring to FIGS. 13A and 13B, the fluctuation of the pole fp in case the variable negative capacitor 81 operated as described above is connected to the anode terminal 101 of the photodetector 11 will be described.

Figure 13:
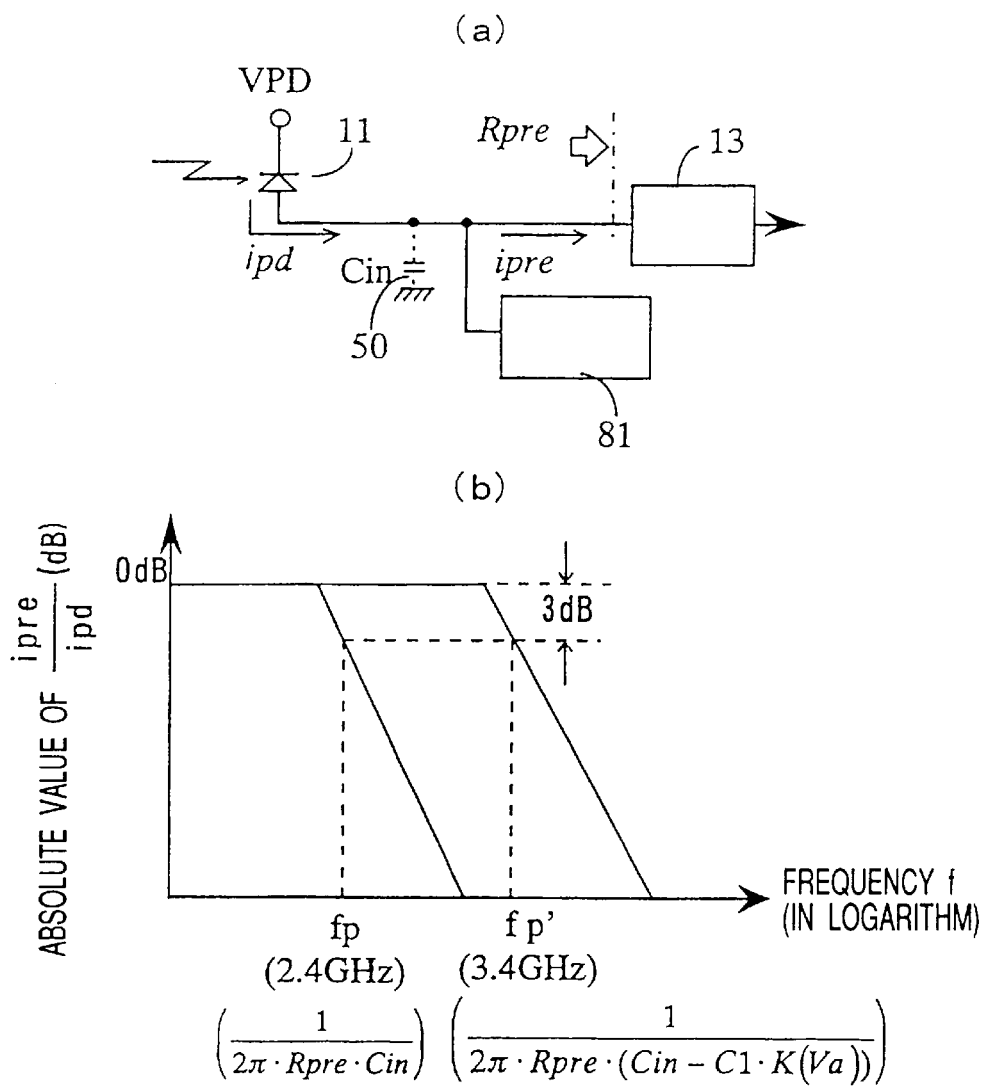
FIG. 13 is an explanatory drawing for explaining the frequency characteristic of an anode terminal of the photodetector shown in FIG. 2.

As shown in the schematic configuration in FIG. 13A, when the variable negative capacitor 81 having the characteristics expressed in the expressions (29) to (31) is connected to the anode terminal 101 of the photodetection 11, the pole fp in case the variable negative capacitor is not connected is raised up to a high frequency. If impedance at the anode terminal 101 of the photodetector 11 is za, za is determined by the parallel connection of the input resistance Rpre of the preamplifier 13, the parasitic capacitor (Cin) 50 of the anode terminal 101 of the photodetector 11 and the input impedance zin of the variable negative capacitor 81. As clear from the expressions (29), (30) and (31), za is as expressed in the following expression (32) in a range of frequencies equal to or below "f<1/(2π·C1·re)".

$$za = \frac{R\ pre}{1 + s \cdot R\ pre \cdot (Cin - C1 \cdot K(Va))} \quad (32)$$

Therefore, a current signal ipre input to the preamplifier 13 is expressed in the following expression if a current signal output by the photodetector 11 is ipd.

$$i\ pre = \frac{i\ pd}{1 + s \cdot R\ pre \cdot (Cin - C1 \cdot K(Va))} \quad (33)$$

The pole fp' is as follows based upon the above expression and $$pole\ f\ p' = \frac{1}{2\pi \cdot R\ pre(Cin - C1 \cdot K(Va))} \quad (34)$$

(However, the pole fp' is in a range in which the pole $$fp' < \frac{1}{2\pi \cdot C1 \cdot re}$$

is met)
the pole fp' can be raised up to a higher frequency, compared with that in a case that the variable negative capacitor 81 is not used. As a result, the bandwidth of the optical receiver can be expanded.

For example, as shown in FIG. 13B, if Cin=0.5 pF and Rpre=40Ω, the bandwidth of the optical receiver is 2.4 GHz. Negative capacitance −0.3 pF is realized by adding the variable negative capacitor 81, the bandwidth can be expanded up to 3.4 GHz and a broadband can be realized by 40%. Also, in case the bandwidth (=2.4 GHz) is equal, the gain of the optical receiver can be increased by 1.4 times by adding the variable negative capacitor 81. Also, if the voltage VBE between the base and the emitter of the transistor is 0.9 V and voltage drop at R1, R2 and Ro is 1 V, the variable negative capacitor 81 is operated at supply voltage 3V.

Figure 11:
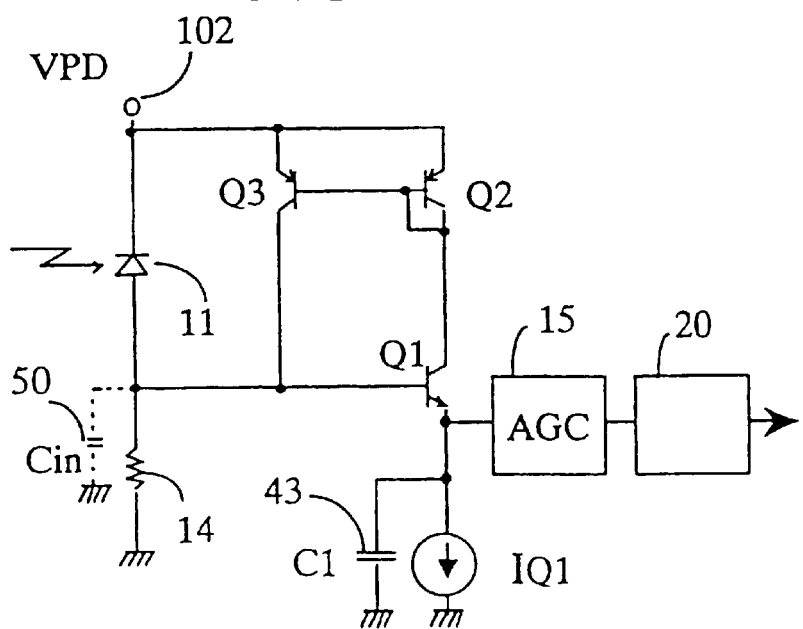
FIG. 11 is a circuit diagram showing an example of an optical receiver using a conventional type negative capacitor.

As described above, according to the second embodiment, in the optical receiver using the variable negative capacitor 81, the parasitic capacitance of the anode terminal 101 of the photodetector 11 can be reduced and the pole fp can be raised up to a high frequency. Therefore, the optical receiver having a broadband can be acquired. Also, in case the bandwidth is equal, the more sensitive optical receiver can be acquired. If a peak occurs in the frequency characteristic of the optical receiver, the potential of the negative capacitance value control terminal 201 can be also regulated so that the frequency characteristic is flat. Also, if dispersion occurs in elements composing the circuit and parasitic capacitance by the manufacture and packaging, the potential of the negative capacitance value control terminal 201 is regulated and the variation of the characteristics of the optical receiver by the dispersion can be reduced. Also, for means for acquiring an arbitrary frequency characteristic, a negative capacitance value can be also controlled. In this embodiment, as no current mirror circuit for inhibiting the operating speed of the negative capacitor described in relation to FIG. 11 is required, the optical receiver in this embodiment is advantageous in high speed operation.

In the second embodiment, to bias the transistors Q1, Q2 and Q3, the resistors R1, R2 and R3 are used, however, even if a constant current source is used instead of them, the similar effect is acquired. It need scarcely be said that biasing means by which parasitic capacitance caused at each connection when the transistor is biased can be reduced is desirable. Also, in case the junction capacitance of the transistor is used in place of the compensating capacitor 43, the similar effect is also acquired. Also, in case the current detection resistor is used in place of the preamplifier 13 in the optical receiver, the principle can be also applied. At that time, a value of the current detection resistor corresponds to the input resistance Rpre of the preamplifier 13.

Embodiment III

Figure 3:
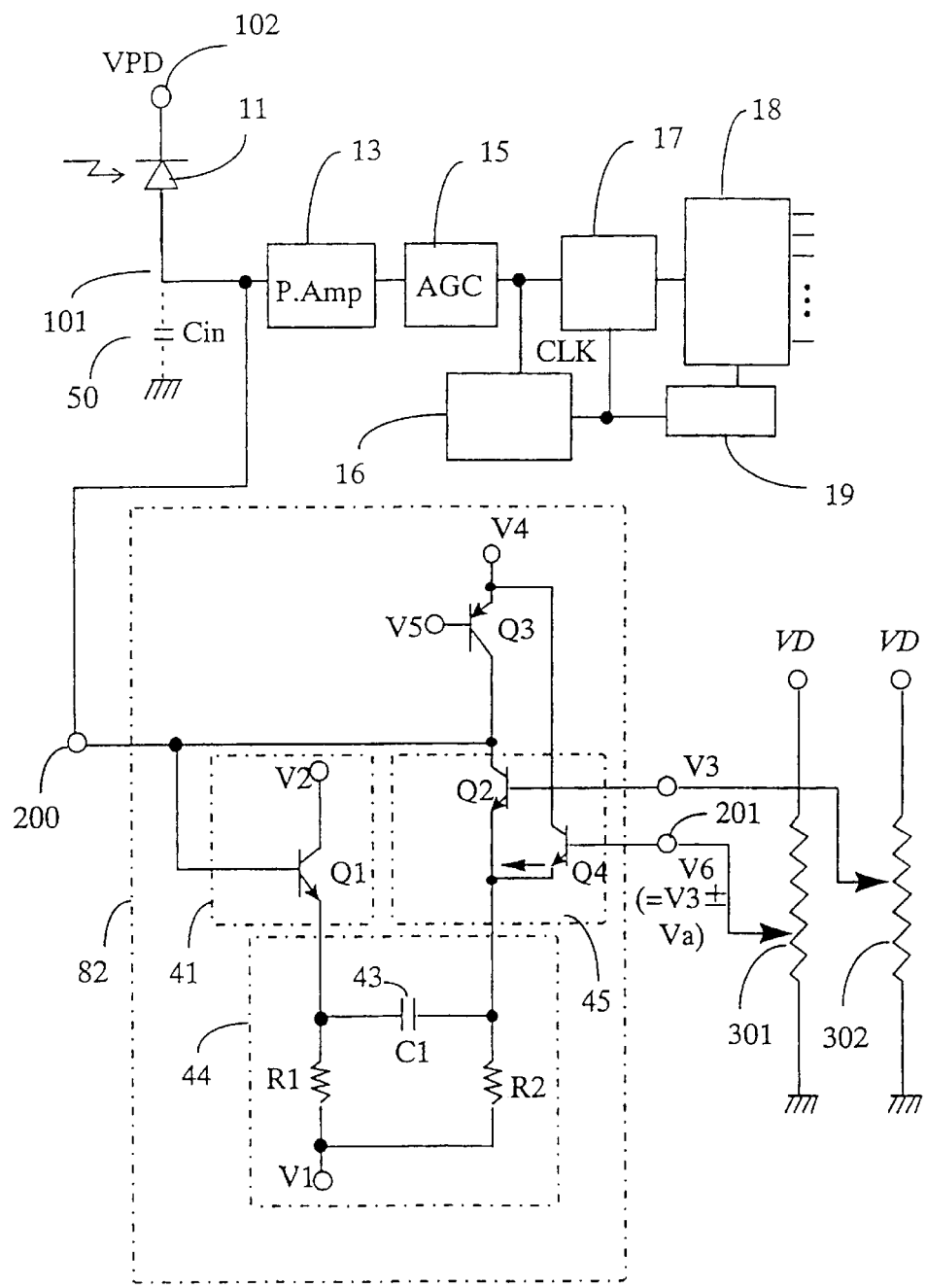
FIG. 3 is a circuit diagram showing a third embodiment of the invention.

FIG. 3 is a circuit diagram showing a third embodiment of the optical receiver according to the invention and there, the variable negative capacitor 81 in the second embodiment shown in FIG. 2 is replaced with a variable negative capacitor 82 that can more decrease a frequency at the lower limit at which the variable negative capacitor is operated as a negative capacitor. The variable negative capacitor 82 used in the third embodiment is composed as follows.

The emitter of a transistor Q1 is connected to a terminal V1 at constant voltage via a resistor R1 and the collector is connected to a terminal V2 at constant voltage. The emitter of a transistor Q2 is connected to the terminal V1 at constant voltage via a resistor R2, the collector is connected to the collector of a transistor Q3 having a conductive type reverse to that of the transistor Q2 and the base is connected to a terminal V3 at constant voltage. The emitter of the transistor Q3 is connected to a terminal V4 at constant voltage and the base is connected to a terminal V5 at constant voltage. The emitter of a transistor Q4 is connected to the emitter of the transistor Q2 and the collector is connected to the terminal V4 at constant voltage. The emitter of the transistor Q1 is connected to the emitter of the transistor Q2 via a capacitor C1 and the collector of the transistor Q2 is connected to the base of the transistor Q1. Further, the base of the transistor Q1 is connected to the input terminal 200 of the variable negative capacitor 82, the base of the transistor Q4 is connected to a negative capacitance value control terminal 201 and the variable negative capacitor 82 is composed. In this embodiment, predetermined potential is also applied to the terminal V3 at constant voltage and a terminal V6 at constant voltage by potentiometers 302 and 301 connected to a driving power source VD of a suitable circuit as in the embodiment shown in FIG. 2. The variable negative capacitor 82 configured as described above is characterized in that the bias current of the transistor Q2 is supplied by a constant current source composed by the transistor Q3.

The lower limit fL of a frequency at which the variable negative capacitor 82 is operated as a negative capacitor is expressed by the expressions (29) to (35).

$$fL = \frac{1}{2\pi \cdot C1 \cdot R0 \cdot K(Va)} \tag{35}$$

C1 denotes a compensating capacitor 43 of the variable negative capacitor 82, K (Va) denotes the conversion factor of a current amplifier 45 and Ro denotes a value of the output resistance of a circuit that applies bias to the transistor Q2. For comparison, the same value is used for K (Va). In the second embodiment, in case fL expressed by the expression (35) is decreased up to a low frequency because Ro is provided by the resistor, Ro is required to be increased. In the third embodiment, bias current is supplied to Q2 by the constant current source composed by the transistor Q3. On condition that the potential of the terminal V4 at constant voltage is fixed, that is, in case supply voltage to the variable negative capacitor is equalized, the output resistance of the constant current source using Q3 is large, compared with that in case bias is applied to Q2 by resistance Ro. Therefore, according to the third embodiment, in a state in which supply voltage is fixed, Ro can be equivalently increased and fL is decreased up to a low frequency. For example, if potential difference between V4 and the collector of Q2 is 1 V and the bias current of Q2 is set to 1 mA, Ro=1 KΩ when the resistor supplies bias current, Ro=approximately 5 KΩ when bias current is supplied using the constant current source composed by the transistor Q3 and fL is decreased up to a frequency of approximately ⅕ by using the constant current source composed by Q3. However, the constants described above are different depending upon the structure of the transistor and the manufacturing method.

Hereby, as the variable negative capacitor 82 used in the third embodiment can realize a negative capacitor at a lower frequency, compared with that in the second embodiment in addition to providing the similar effect to the effect described in the second embodiment, the pole fp is raised up to a high frequency by negative capacitance and the optical receiver having a broadband can be realized because a range of operating frequencies of the variable negative capacitor is large even if the pole fp caused by the parasitic capacitance 50 of the anode terminal 101 of the photodetector 11 is a low frequency.

Embodiment IV

Figure 4:
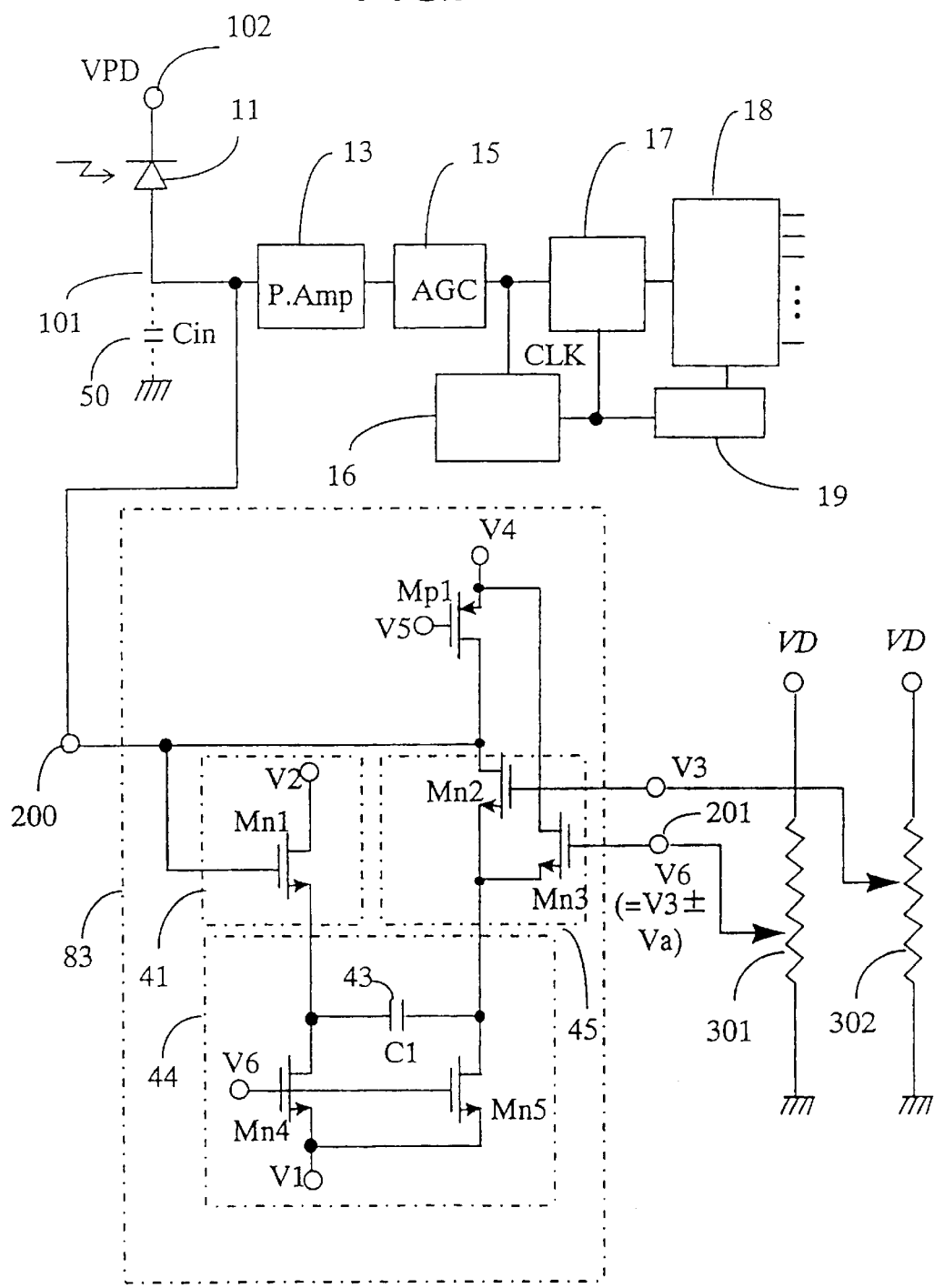
FIG. 4 is a circuit diagram showing a fourth embodiment of the invention.

FIG. 4 is a circuit diagram showing a fourth embodiment of the optical receiver according to the invention and the variable negative capacitor 81 in the second embodiment shown in FIG. 2 is replaced with a variable negative capacitor 83 operated at low supply voltage. The variable negative capacitor 83 used in the fourth embodiment is configured as follows.

The source of a field-effect transistor (FET) Mn1 is connected to the drain of a field-effect transistor Mn4 and the drain of Mn1 is connected to a terminal V2 at constant voltage. The source of the FET MN4 is connected to a terminal V1 at constant voltage and the gate is connected to a terminal V6 at constant voltage. The source of FET Mn2 is connected to the drain of FET Mn5 and the drain of Mn2 is connected to the drain of FET Mp1 having a conductive type reverse to that of the FET Mn2. The source of the FET Mn5 is connected to the terminal V1 at constant voltage and the gate is connected to the terminal V6 at constant voltage. The source of the FET Mp1 is connected to a terminal V4 at constant voltage and the gate is connected to a terminal V5 at constant voltage. The source of sixth FET Mn3 is connected to the source of the FET Mn2, the drain is connected to the terminal V4 at constant voltage and the drain of the FET Mn2 is connected to the gate of the FET Mn1. Further, the gate of the FET Mn1 functions as the input terminal 200 of the variable negative capacitor 83, the gate of the FET Mn3 functions as a negative capacitance value control terminal 201 and the variable negative capacitor 83 is composed. In this embodiment, predetermined potential is also applied to the terminal V3 at constant voltage and the terminal V6 at constant voltage by potentiometers 302 and 301 connected to a driving power source VD of a suitable circuit as in the embodiment shown in FIG. 3. The similar effect to the variable negative capacitor 81 used in the second embodiment is not only acquired by using the variable negative capacitor 83 configured as described above but the lower limit of a frequency at which the variable negative capacitor 83 is operated as a negative capacitor is low because bias current is applied to the FET Mn2 by a constant current source composed by FET Mp2 as in the variable negative capacitor 82 used in the third embodiment and the variable negative capacitor 83 can be operated in a wide range as a negative capacitor.

Further, the supply voltage of the variable negative capacitor can be reduced by configuring the variable negative capacitor by the field-effect transistors and the optical receiver excellent in reducing voltage and power consumption can be configured. The effect will be described below using an example.

For the threshold voltage of two field-effect transistors having different conductive types, the threshold Vthn of the N-type shall be 0.5 V and the threshold Vthp of the P-type shall be −0.5 V for example. Voltage |Vgs| applied between the gate and the source is set to 0.8 V, voltage |Vds| applied between the drain and the source is set to 0.3 V and the values are used in common for both N-type and P-type field-effect transistors to normally operate the field-effect transistors. Therefore, for the voltage of each field-effect transistor required for normally operating the variable negative capacitor 83 in the embodiment shown in FIG. 4, in the case of Mn4, |Vds|=0.3 V, in the case of Mn1, |Vgs|=0.8 V and in the case of Mp1, |Vds|=0.3 V.

That is, according to this embodiment, the variable negative capacitor 83 can be operated at supply voltage 1.4 V. In the second embodiment, as the bipolar transistors are used, the lower limit of the supply voltage is 3 V, however, according to the fourth embodiment, it can be operated at approximately 1.4 V.

Embodiment V

Figure 5:
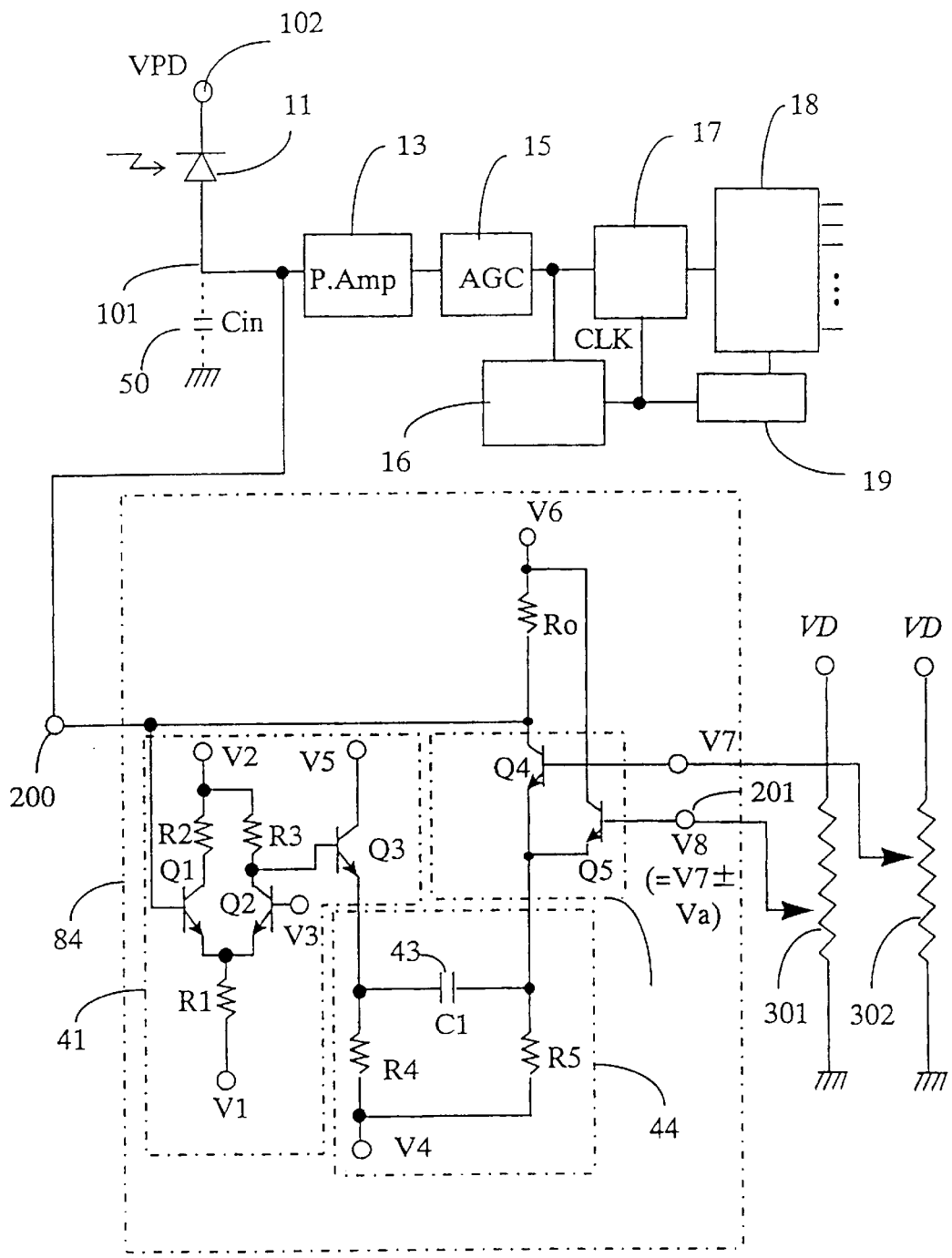
FIG. 5 is a circuit diagram showing a fifth embodiment of the invention.

FIG. 5 is a circuit diagram showing a fifth embodiment of the optical receiver according to the invention and the variable negative capacitor 81 in the second embodiment shown in FIG. 2 is replaced with a variable negative capacitor 84 that can be operated with capacity of small area as large capacity. The variable negative capacitor 84 used in the fifth embodiment is configured as follows.

The emitter of a transistor Q1 is connected to a terminal V1 at constant voltage via a resistor R1 and the collector is connected to a terminal V2 at constant voltage via a resistor R2. The emitter of a transistor Q2 is connected to the emitter of the transistor Q1, the collector is connected to the terminal V2 at constant voltage via a resistor R3 and the base is connected to a terminal V4 at constant voltage. The base of a transistor Q3 is connected to the collector of the transistor Q2, the emitter is connected to a terminal V4 at constant voltage via a resistor R4 and the collector is connected to a terminal V5 at constant voltage. The emitter of a transistor Q4 is connected to the terminal V4 at constant voltage via a resistor R5, the collector is connected to a terminal V6 at constant voltage via a resistor Ro, the base is connected to a terminal V7 at constant voltage, the emitter of the transistor Q3 is connected to the emitter of the transistor Q4 via a capacitor C1, the emitter of a transistor Q5 is connected to the emitter of the transistor Q4, the collector is connected to the terminal V6 at constant voltage, the collector of the transistor Q4 is connected to the base of the transistor Q1, the base of the transistor Q1 functions as the input terminal of the variable negative capacitor 84, the base of the transistor Q5 functions as a negative capacitance value control terminal 201 and the variable negative capacitor 84 is configured. In this embodiment, predetermined potential is also applied a terminal V8 at constant voltage and a terminal V7 at constant voltage by potentiometers 302 and 301 connected to the driving power source VD of a suitable circuit as in the embodiment shown in FIG. 3.

As the variable negative capacitor 84 configured as described above applies AC voltage amplified in the following step to a compensating capacitor 43 after input AC voltage vi is amplified in a voltage amplifier 41 provided with gain gm12·R3 determined by mutual conductance gm12 by Q1 and Q2 and load resistance R3, a value of a negative capacitor Cn is determined by the following expression (36).

$$Cn = -C1 \cdot K(Va) \cdot (gm12 \cdot R3) \tag{36}$$

C1 is a value of the compensating capacitor 43, K (Va) is the conversion factor of a current amplifier 45 and is 1 or below 1 in the configuration of the variable negative capacitor 84. If the ratio of gm12·R3 is set so that K (Va)·gm12·R3 is 1 or above 1, a negative capacitor having larger capacity than the compensating capacitor 43 can be realized. For example, if K (Va) is 0.5 and gm12·R3 is 4, −2·C1 is acquired for the negative capacitor Cn. Therefore, for the variable negative capacitor 84 used in the fifth embodiment, the size of the compensating capacitor 43 can be reduced, compared with that in the second embodiment on a condition of realizing the same negative capacitor in addition to providing the similar effect to the effect described in the second embodiment.

Embodiment VI

Figure 6:
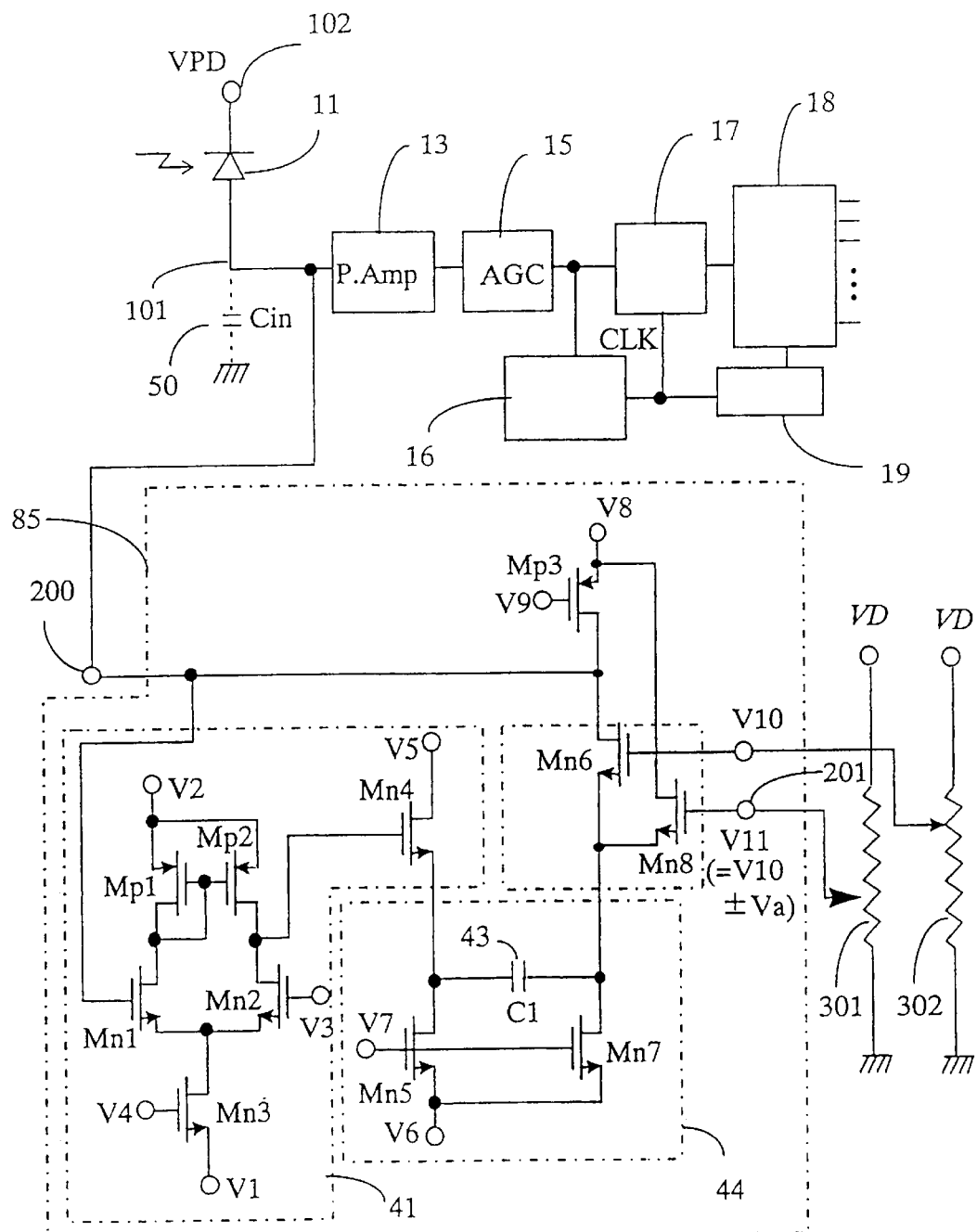
FIG. 6 is a circuit diagram showing a sixth embodiment of the invention.

FIG. 6 is a circuit diagram showing a sixth embodiment of the optical receiver according to the invention and the variable negative capacitor 81 in the second embodiment shown in FIG. 2 is replaced with a variable negative capacitor 85 that can be operated at capacity of small area as large capacity and is operated at low supply voltage. The variable negative capacitor used in the sixth embodiment is configured as follows.

The source of a field-effect transistor Mn1 is connected to the drain of a field-effect transistor (FET) Mn3 and the drain of Mn1 is connected to the drain of FET Mp1 having a conductive type reverse to that of Mn1. The source of FET Mn2 is connected to the source of the FET Mn1, the drain of Mn2 is connected to the drain of FET Mp2 having a conductive type reverse to that of Mn2, and the gate and the drain of the FET Mp1 are connected to the gate of the FET Mp2. The source of FET Mn3 is connected to a terminal V1 at constant voltage and the gate of Mn3 is connected to a terminal V4 at constant voltage. Each source of the FET Mp1 and the FET Mp2 is connected to a terminal V2 at constant voltage and the gate of the FET Mn2 is connected to a terminal V3 at constant voltage. The gate of FET Mn4 is connected to the drain of the FET Mn2 and the source of Mn4 is connected to the drain of FET Mn5 and the drain of Mn4 is connected to a terminal V5 at constant voltage. The source of FET Mn6 is connected to the drain of FET Mn7 and the drain of Mn6 is connected to the drain of FET Mp3. Each source of the FET Mn5 and FET Mn7 is connected to a terminal V6 at constant voltage and the gate is connected to a terminal V7 at constant voltage. The drain of the FET Mp3 is connected to a terminal V8 at constant voltage and the gate is connected to a terminal V9 at constant voltage. The source of FET Mn8 is connected to the source of the FET Mn6 and the drain of Mn8 is connected to the terminal V8 at constant voltage. The source of the FET Mn4 is connected to the source of the FET Mn6 via a capacitor C1. Further, the drain of the FET Mn6 is connected to the gate of the FET Mn1, the gate of the FET Mn1 functions as the input terminal of the variable negative capacitor 85, the gate of the FET Mn8 functions as a negative capacitance value control terminal 201 and the variable negative capacitor 85 is configured. In this embodiment, predetermined potential is also applied to a terminal V10 at constant voltage and a terminal V11 at constant voltage by potentiometers 302 and 301 connected to the driving power source VD of a suitable circuit as in the embodiment shown in FIG. 3.

As the variable negative capacitor 85 configured as described above applies AC voltage applied to the gate of the FET Mn1 and amplified in the following step to a compensating capacitor 43 after the AC voltage is amplified in a voltage amplifier 41 provided with gain am determined based upon the ratio in gate length of the field-effect transistors Mn1, Mn2, Mp1 and Mp2, a value of a negative capacitor Cn is determined by the following expression.

$$Cn = -C1 \cdot K(Va) \cdot Am \tag{37}$$

In this case, K (Va) denotes the conversion factor of a current amplifier 45 composed by the field-effect transistors Mn4 and Mn6 and is 1 or below 1 in the configuration of the variable negative capacitor 85. As a negative capacitor having larger capacity than the compensating capacitor 43 (C1) can be realized and a negative capacitance value larger than the area of the compensating capacitor 43 can be realized if a value of the gain Am is set so that K (Va)·Am is 1 or above 1, the variable negative capacitor of small area can be configured. Also, the variable negative capacitor 85 has an advantage that it can be operated at low supply voltage. For example, for the threshold voltage of field-effect transistors of two different conductive types, in the case of an N type, the threshold Vthn shall be 0.5 V and in the case of a P type, the threshold Vthp shall be −0.5V. Voltage |Vgs| applied between the gate and the source is 0.8V and voltage |Vds| applied between the drain and the source is 0.3 V to normally operate the field-effect transistors and the values are used in common for the N-type and P-type field-effect transistors. As clear from FIG. 6, for the voltage of each field-effect transistor required for normally operating the variable negative capacitor 85, in the case of Mn3, |Vds|=0.3 V, in the case of Mn1, |Vgs|=0.8 V and in the case of Mp3, |Vds|=0.3 V. Therefore, the variable negative capacitor 85 can be operated at the supply voltage of 1.4 V. In the second and fifth embodiments, as the bipolar transistors are used, the lower limit of supply voltage that enables normal operation is 3 V, however, according to the sixth embodiment, the operation at approximately 1.4 V is enabled.

As clear from the above description, the similar effect to the effect described in the second embodiment is not only acquired by using the variable negative capacitor 85 in the sixth embodiment but the optical receiver the area of the variable negative capacitor in which is small and which can be operated at low voltage can be configured.

Embodiment VII

Figure 7:
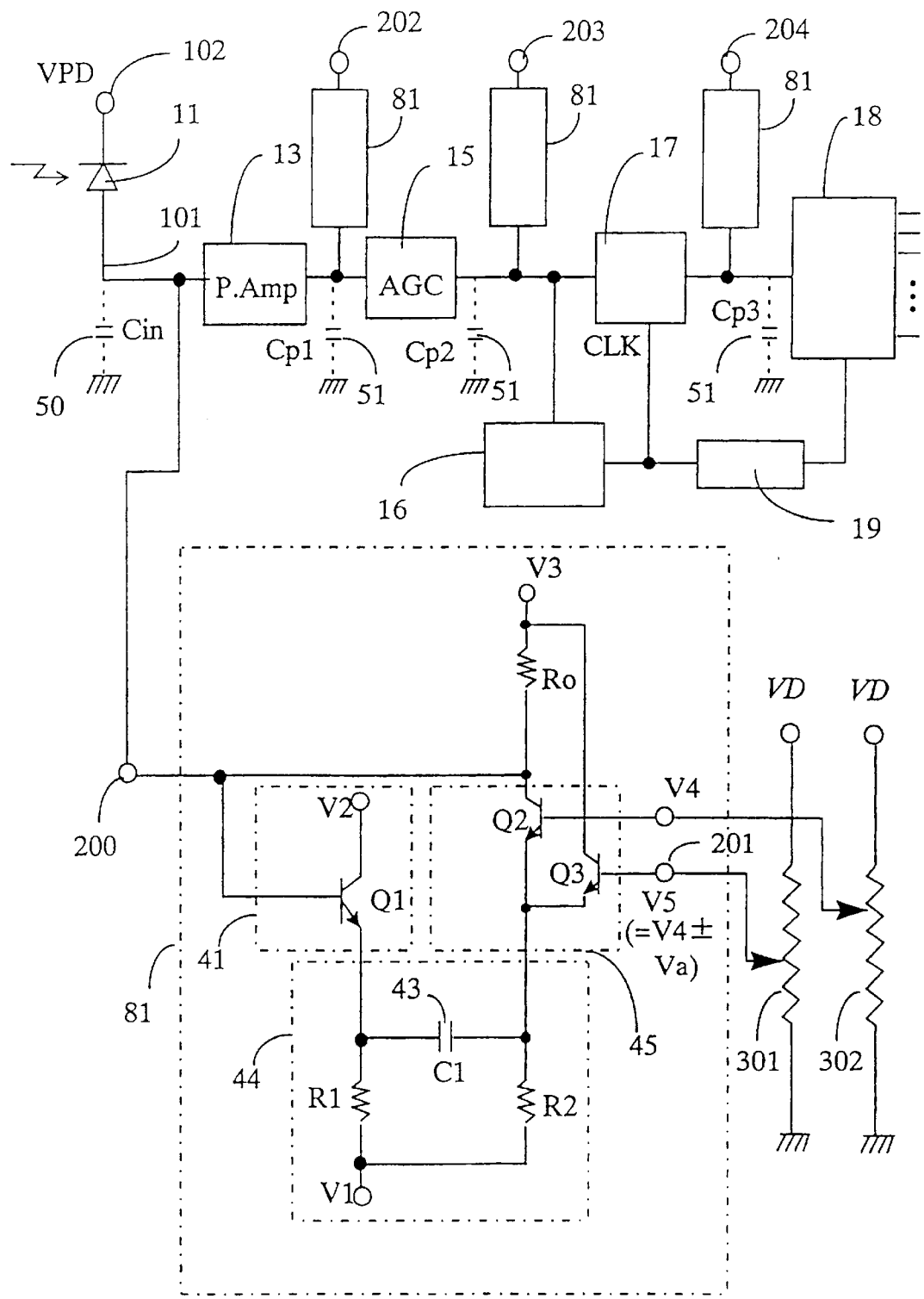
FIG. 7 is a circuit diagram showing a seventh embodiment of the invention.

FIG. 7 is a circuit diagram showing a seventh embodiment of the optical receiver according to the invention.

In the optical receiver shown in FIG. 7, an anode terminal 101 of a photodetector 11 is connected to the input terminal of a preamplifier 13. A current signal output by the photodetector 11 is converted to a voltage signal in the preamplifier 13 and is input to a demultiplexer 18 via an AGC amplifier 15 and a decision circuit 17. The demultiplexer 18 demultiplexes the input voltage signal into plural parallel signals and supplies them to a signal processor of a subsequent stage. Also, a clock extraction circuit 16 supplies a clock pulse to the decision circuit 17 and further to the demultiplexer 18 via a frequency divider 19.

In the seventh embodiment, the plural variable negative capacitors 81 used in the second-embodiment are provided and are connected to a connection of the anode terminal 101 of the photodetector 11, the preamplifier 13 and the AGC amplifier 15, a connection of the AGC amplifier 15 and the decision circuit 17 and a connection of the decision circuit 17 and the demultiplexer 18. Capacitance Cp1 to Cp3 denote parasitic capacitance 51 caused by wiring at the connection of the preamplifier 13 and the AGC amplifier 15, the connection of the AGC amplifier 15 and the decision circuit 17 and the connection of the decision circuit 17 and the demultiplexer 18. In the optical receiver, a connection having a large time constant because of parasitic capacitance is also caused except the anode terminal 101 of the photodetector 11. As each circuit is connected via thick wire provided on a substrate as means for connection and a pad for connecting wires at any connection except the anode terminal 191 of the photodetector 11 of the connections described above, the parasitic capacitance is large, compared with that at another node in the optical receiver and a large time constant is caused.

Then, in the seventh embodiment, the variable negative capacitor 81 is connected to each connection in the optical receiver, a value of the parasitic capacitance is equivalently reduced and a value of a time constant is reduced. The configuration of each variable negative capacitor 81 may be the same, negative capacitance value control terminals 201, 202, 203 and 204 can be independently controlled and each connection has only to be regulated so that each connection has an optimum negative capacitance value. Hereby, plural time constants existing on a signal path of the optical receiver can be reduced. The frequency characteristic of the optical receiver is not determined only by the time constant of each connection, however, as the deterioration of the frequency characteristic caused by the time constant of each connection can be prevented, the bandwidth of the optical receiver is expanded and the optical receiver having a broadband can be acquired. Also, as the load capacitance of output from the preamplifier 13, the AGC amplifier 15 and the decision circuit 17 is reduced, driving current for the output load of each circuit can be reduced and the power consumption of each circuit can be reduced.

Embodiment VIII

Figure 8:
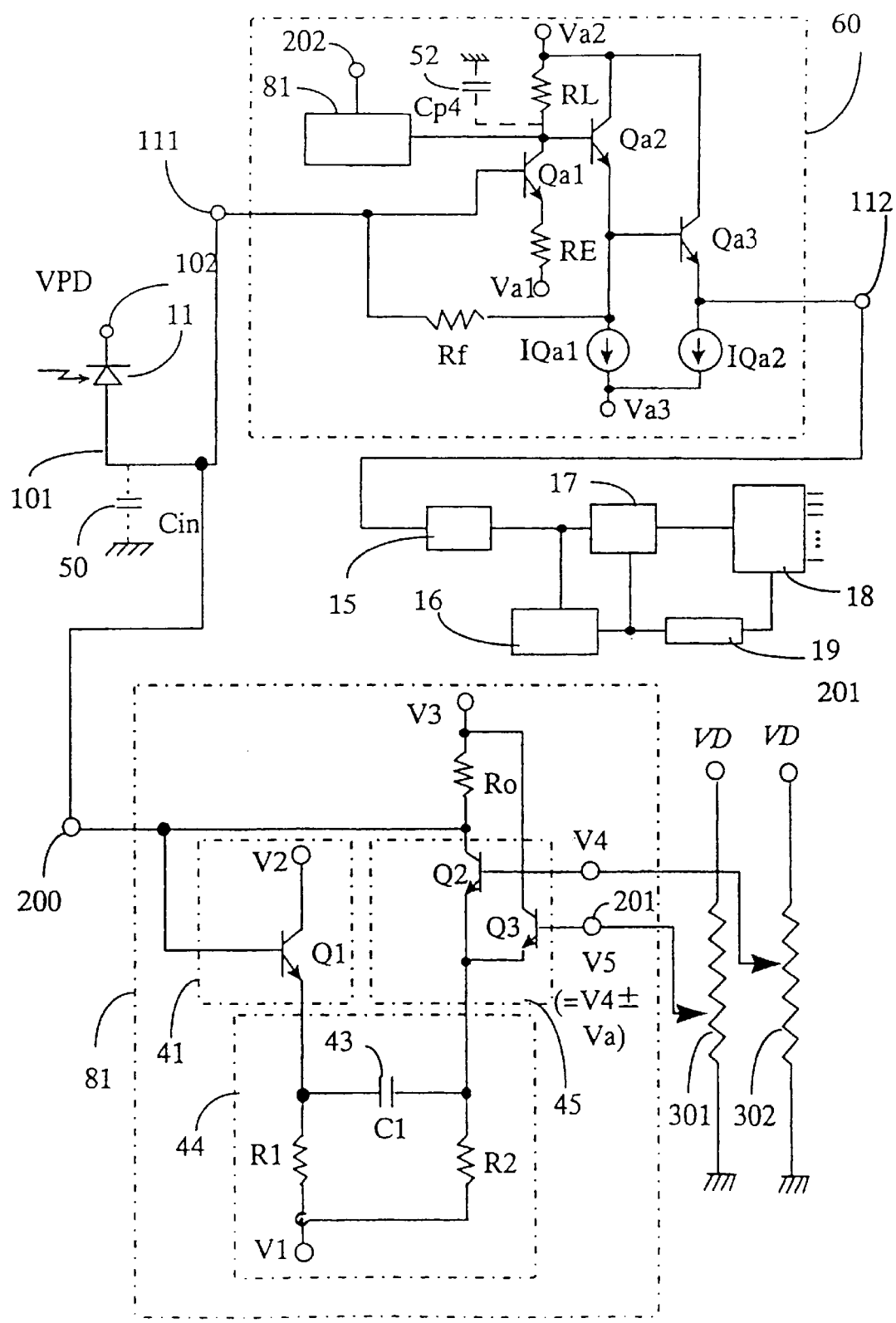
FIG. 8 is a circuit diagram showing an eighth embodiment of the invention.

FIG. 8 is a circuit diagram showing an eighth embodiment of the optical receiver according to the invention and the preamplifier 13 in the second embodiment is replaced with a preamplifier 60 in which the variable negative capacitor 81 is built.

For the preamplifier 60 in which the variable negative capacitor 81 is built, the emitter of a transistor Qa1 is connected to a terminal Va1 at constant voltage via a resistor RE and the collector is connected to a terminal Va2 at constant voltage via a resistor RL. The base of a transistor Qa2 is connected to the collector of the transistor Qa1, the emitter is connected to a terminal Va3 at constant voltage via a constant current source IQa1 and the collector is connected to the terminal Va2 at constant voltage. The base of a transistor Qa3 is connected to the emitter of the transistor Qa2, the emitter is connected to the terminal Va3 at constant voltage via a constant current source IQa2, the collector is connected to the terminal Va2 at constant voltage, one terminal of a resistor Rf is connected to the base of the transistor Qa1 and the other terminal is connected to the emitter of the transistor Qa2. The base of the transistor Qa1 functions an input terminal and the emitter of the transistor Qa3 functions as an output terminal. Capacitance Cp4 denotes parasitic capacitance 52 caused between the collector of the transistor Qa1 and the ground.

In the eighth embodiment, the pole fp1' determined by the time constant of the anode terminal 101 of the photodetector 11 and the pole fp2' determined by the time constant of the collector of the transistor Qa1 of the preamplifier 60 can be controlled in the variable negative capacitor by configuring as described above. The pole fp1' and the pole fp2' are expressed using a parameter of the variable negative capacitor by the following expressions.

$$pole\ f\ p1' = \frac{1}{2\pi \cdot R\ pre(Cin - C1 \cdot K \cdot A1)} \quad (38)$$

$$pole\ f\ p2' = \frac{1}{2\pi \cdot RL(Cp4 - C2 \cdot K2 \cdot A2)} \quad (39)$$

C1 and C2 respectively denote a compensating capacitor 43 of the variable negative capacitor 81 connected to the anode terminal 101 of the photodetector 11 and a compensating capacitor C2 (not shown) of the variable negative capacitor 81 connected to the collector of the transistor Qa1 of the preamplifier 60. K1 and K2 denote a factor varied by voltage applied to the respective negative capacitance value control terminals. Also, A1 and A2 denote the gain of a voltage amplifier composing respective variable negative capacitors.

In the preamplifier 60, in case the collector of the transistor Qa1 has the pole of a low frequency next to the anode terminal 101 of the photodetector 11, the ratio of the pole fp1' and the pole fp2' determines the waveform of the frequency characteristic of output voltage from the preamplifier 60 to a current signal and determines the number of peaks that emerge in the frequency characteristic for example. In case a value of the pole fp2' is fixed, the ratio, the pole fp2' and/the pole fp1' are formerly uniquely determined by the pole fp1'. However, as the pole fp2' can be varied by connecting the variable negative capacitor 81 to the collector of the transistor Qa1 of the preamplifier 60, the pole fp1' that determines the bandwidth of the optical receiver, the ratio that determines the waveform of the frequency characteristic, the pole fp2' and/the pole fp1' can be independently regulated. That is, the above configuration enables the bandwidth and the flatness of the frequency characteristic of the optical receiver to be independently set and enables the optical receiver to have a broadband.

Embodiment XI

Figure 9:
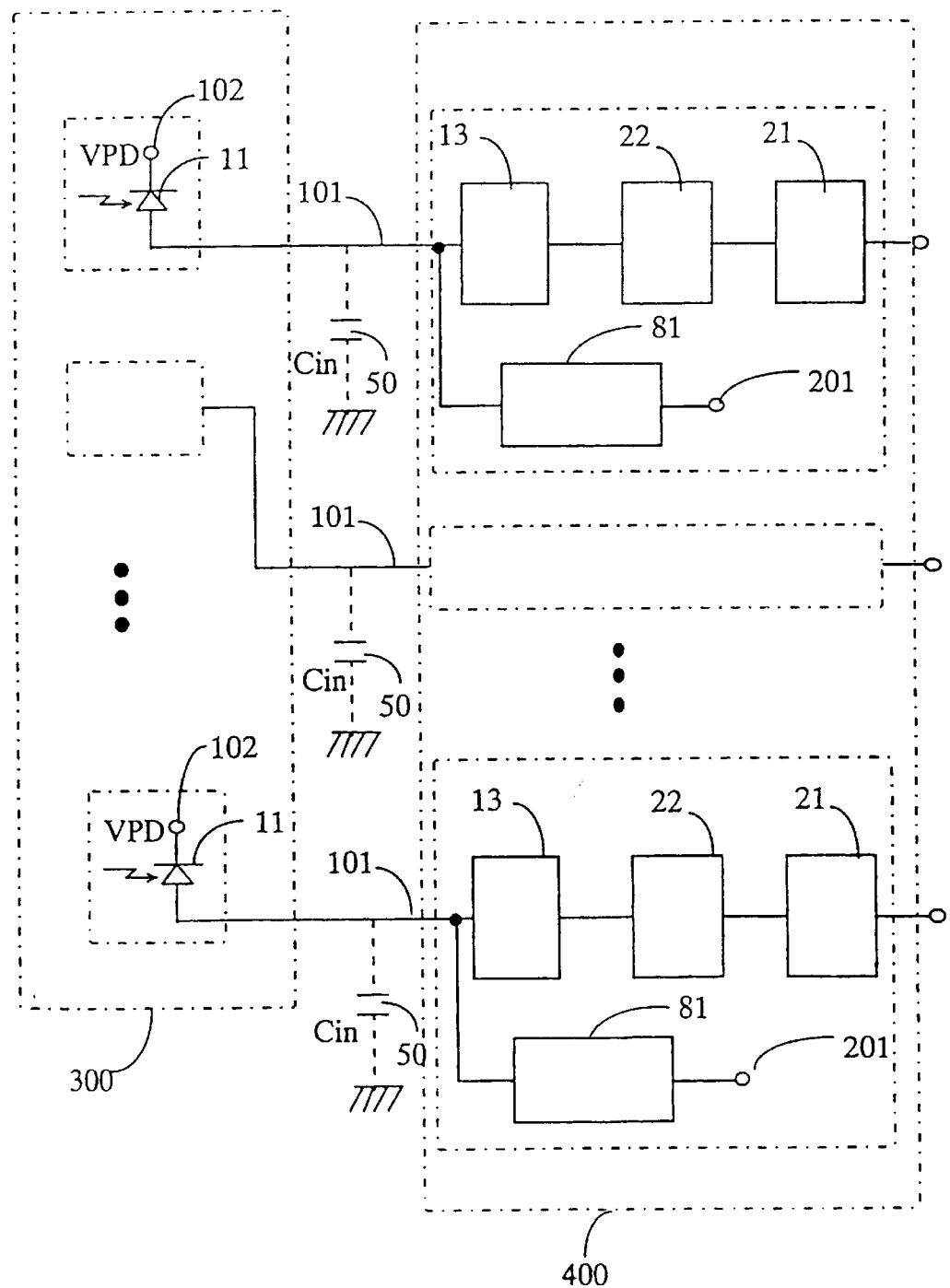
FIG. 9 is a circuit diagram showing a ninth embodiment of the invention.
Figure 10:
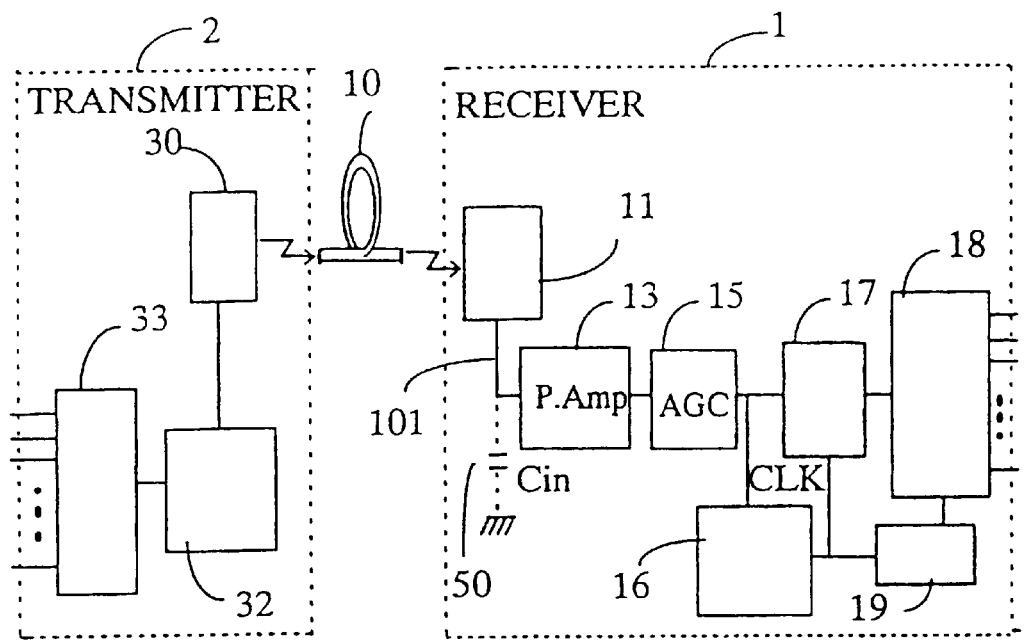
FIG. 10 a block diagram showing an example of the configuration of a conventional type optical transmission system.

FIG. 9 is a circuit diagram showing a ninth embodiment of the optical receiver according to the invention and the variable negative capacitor 81 in the second embodiment is applied to the configuration of the optical receiver provided with plural parallel data channels. The optical receiver is provided with a photodetector array 300 including plural photodetectors 11 and signal processing means 400 including plural preamplifiers 13, plural voltage amplifiers 22 and plural comparators 21, each photodetector 11 of the photodetector array 300 and the preamplifier 13 of the signal processing means 400 are connected and each corresponds to each channel of parallel data. Also, in each of parallel data channels, the variable negative capacitor 81 is connected to the anode terminal 101 of the photodetector 11.

The deterioration of the frequency characteristic by the parasitic capacitance (Cin) 50 of the anode terminal 101 is not only prevented owing to the configuration but in case the parasitic capacitance of arrayed photodetectors 11 of each channel and parasitic capacitance caused by packaging have dispersion between channels, the dispersion of the frequency characteristic of each channel is reduced by independently regulating voltage applied to a negative capacitance value control terminal 201 of each channel and a parallel data channel having the similar frequency characteristic can be composed.

In the seventh to ninth embodiments, the similar effect is also acquired in case the variable negative capacitor 82 described in the third embodiment is used in place of the variable negative capacitor 81 and in addition, as the variable negative capacitor 82 can store negative capacitance from a low frequency, compared with the variable negative capacitor 81, the pole fp is raised up to a high frequency owing to negative capacitance even if the pole fp caused by the parasitic capacitance Cin of the anode terminal of the photodetector 11 is at a low frequency and the optical receiver having a broadband is acquired.

Also, the similar effect is also acquired in case the variable negative capacitor 83 described in the fourth embodiment is used in place of the variable negative capacitor 81 and in addition, as the variable negative capacitor 83 is operated even if supply voltage to the variable negative capacitor is reduced up to 1.4 V, the power consumption of the variable negative capacitor is small. Therefore, as the variable negative capacitor can be operated at low voltage without regulating the supply voltage of the optical receiver, the optical receiver which is operated at low voltage and the power consumption of which is small can be configured.

Also, the similar effect is also acquired in case the variable negative capacitor 84 described in the fifth embodiment is used in place of the variable negative capacitor 81 and in addition, oh a condition of realizing the same negative capacitance, a compensating capacitor C1 can be composed in small area, compared with the case in which the variable negative capacitor 81 is used. Hereby, the optical receiver provided with the variable negative capacitor having small area can be configured.

Also, the similar effect is also acquired in case the variable negative capacitor 85 described in the sixth embodiment is used in place of the variable negative capacitor 81 and in addition, the optical receiver operated at low voltage and provided with the variable negative capacitor the area of which is small can be configured, compared with the case in which the variable negative capacitor 81 is used.

In the embodiments described above, a capacitance value for each variable negative capacitor to have is determined based upon voltage applied to the negative capacitance value control terminals 201 to 204 and therefore, voltage applied to the negative capacitance value control terminals 201 to 204 has only to be varied in view of the frequency characteristic of an output signal at a connection of the AGC amplifier 15 and a decision circuit 17 for example in each embodiment. That is, as clear from the characteristic shown in FIG. 13B, as the characteristic varies according to the change of voltage, a point at which an optimum value is acquired is searched and the state has only to be held. In this embodiment, voltage is regulated using a potentiometer, however, a convenient meter suitable for the configuration of the device may be arbitrarily selected.

The invention is not limited to the first to the ninth embodiments described referring to FIGS. 1 to 9 and various variations are allowed in a range that does not deviate from the object. For example, in the seventh to the ninth embodiments, plural variable negative capacitors are used, however, in case the plural variable negative capacitors are selected out of the variable negative capacitors 81, 82, 83, 84 and 85 described in the second to the sixth embodiments and they are mixed in one optical receiver, the similar effect is also acquired. In case the junction capacitance of the transistor, capacitance between wiring and the parasitic capacitance of a pad used for the connection of wiring are used for the compensating capacitor used in the variable negative capacitor, the similar effect is also acquired. In the above embodiments, the bipolar transistor and the field-effect transistor are used, however, in case they are replaced with a heterojunction bipolar transistor (HBT), a high electron mobility transistor (HEMT) and a metal semiconductor field-effect transistor (MES-FET), the similar effect is also acquired. Also, parasitic capacitance is not only reduced by the variable negative capacitor but impedance at a node of a circuit can be also turned negative by increasing a negative capacitance value, however, it need scarcely be said that a value of negative capacitance should be regulated in a range in which stable operation as the optical receiver is acquired.

According to the invention, even if the photodetector having large detection area is adopted and the current detection resistor having large resistance and the preamplifier having large input resistance are used, the frequency characteristic is not deteriorated and the optical receiver the frequency characteristic of which is satisfactory can be provided by configuring the optical receiver using the variable negative capacitor. Also, as means for regulating a negative capacitance value is provided, the fluctuation due to the dispersion of the elements composing the circuit and parasitic capacitance respectively caused by the manufacture and packaging of the frequency characteristic of the optical receiver can be reduced. Further, different frequency characteristics can be also produced from the optical receivers manufactured in the same manufacturing process by regulating a variable negative capacitance value according to the purpose.

What is claimed is:

1. An optical receiver, comprising:
    a photodetector to which an optical modulated signal is input and which outputs photoelectric current;
    a preamplifier the input terminal of which is connected to an anode terminal of the photodetector, which converts a current signal to a voltage signal and outputs the voltage signal;
    an automatic gain controllable amplifier that keeps the amplitude of the voltage signal output from the preamplifier at a predetermined value;

means for processing a signal output from the automatic gain controllable amplifier and acquiring predetermined digitalized electric information; and a variable negative capacitor connected to the anode terminal of the photodetector, wherein:

the variable negative capacitor generates negative capacitance at the input terminal of the preamplifier and the quantity of the negative capacitance is variable according to a control voltage.

2. An optical receiver according to claim 1, wherein:

said preamplifier is a current detection resistor that generates a voltage signal corresponding to a photoelectric current signal output from a photodetector to which an optical modulated signal is input and which outputs photoelectric current.

3. An optical receiver, comprising:

a photodetector to which an optical modulated signal is input and which outputs photoelectric current;

a preamplifier the input terminal of which is connected to an anode terminal of the photodetector, which converts a current signal to a voltage signal and outputs the voltage signal;

an automatic gain controllable amplifier that keeps the amplitude of the voltage signal output from the preamplifier at a predetermined value;

means for processing a signal output from the automatic gain controllable amplifier and acquiring predetermined digitalized electric information; and first, second, and third variable negative capacitors respectively connected to the anode terminal of the photodetector, an output terminal of the preamplifier, and an output terminal of the automatic gain controllable amplifier, wherein:

the first variable negative capacitor generates a negative capacitance at the input terminal of the preamplifier, the quantity of the negative capacitance is variable according to a control voltage, and each of the first, second, and third variable negative capacitors can be independently controlled through the magnitude of the control voltage.

4. An optical receiver according to claim 3, wherein:

said means for processing a signal output from the automatic gain controllable amplifier and acquiring predetermined digitalized electric information is a decision circuit that discriminates a voltage signal output from the automatic gain controllable amplifier as a digital signal and a demultiplexer that demultiplexes a signal output from the decision circuit into plural parallel signals.

5. An optical receiver, comprising:

a plurality of photodetectors to each of which an optical modulated signal is input and each of which outputs photoelectric current;

a plurality of signal processing channels respectively connected to said photodetectors, each signal processing channel including:

a preamplifier, the input terminal of which is connected to an anode terminal of the respective photodetector, which converts a current signal to a first voltage signal and outputs the first voltage signal;

a voltage amplifier connected to said preamplifier, that amplifies the first voltage signal output from the preamplifier;

a comparator connected to said voltage amplifier, that compares a second voltage signal output from the voltage amplifier with a reference potential provided in the comparator and outputs a third voltage signal; and a variable negative capacitor connected to the anode terminal of each photodetector, wherein:

the variable negative capacitor generates negative capacitance at the input terminal of the preamplifier and the quantity of the negative capacitance is variable according to a control voltage.

6. An optical receiver according to claim 1, wherein:

in said preamplifier, connection is made as follows;

the emitter of a first transistor is connected to a first terminal at constant voltage via a first resistor and the collector is connected to a second terminal at constant voltage via a second resistor;

the base of a second transistor is connected to the collector of the first transistor, the emitter is connected to a third terminal at constant voltage via a first constant current source and the collector is connected to the second terminal at constant voltage;

the base of a third transistor is connected to the emitter of the second transistor, the emitter is connected to the third terminal at constant voltage via a second constant current source and the collector is connected to the second terminal at constant voltage;

one terminal of a third resistor is connected to the base of the first transistor and the other terminal is connected to the emitter of the second transistor;

the base of the first transistor functions as an input terminal and the emitter of the third transistor functions as an output terminal; and the output terminal of the variable negative capacitor is connected to the collector of the first transistor.

7. An optical receiver according to claim 1, wherein:

said variable negative capacitor comprises:

a voltage amplifier which has an input terminal at high impedance and output voltage which is in phase with input voltage;

a compensating capacitor to which output voltage from the voltage amplifier is applied;

a current inversion circuit that generates current acquired by inverting the phase of current which flows in the compensating capacitor; and a current amplifier that amplifies and outputs current output from the current inversion circuit and can regulate the degree of amplification based upon voltage applied to a current amplification factor control terminal.

8. An optical receiver according to claim 1, wherein:

in said variable negative capacitor, connection is made as follows;

the emitter of a first transistor is connected to a first terminal at constant voltage via a first constant current source or a first resistor and the collector is connected to a second terminal at constant voltage;

the emitter of a second transistor is connected to the first terminal at constant voltage via a second constant current source or a second resistor, the collector is connected to a third terminal at constant voltage via a third constant current source or a third resistor and the base is connected to a fourth terminal at constant voltage;

the emitter of the first transistor is connected to the emitter of the second transistor via a capacitor;

the emitter it a third transistor is connected to the emitter of the second transistor and the collector is connected to the third terminal at constant voltage;

the collector of the second transistor is connected to the base of the first transistor; and the base of the first transistor functions as the input terminal of the variable negative capacitor and the base of the third transistor functions as a negative capacitance value control terminal.

9. An optical receiver according to claim 1, wherein:

in said variable negative capacitor, connection is made as follows;

the emitter of a first transistor is connected to a first terminal at constant voltage via a first constant current source or a first resistor and the collector is connected to a second terminal at constant voltage;

the emitter of a second transistor is connected to the first terminal at constant voltage via a second constant current source or a second resistor, the collector is connected to the collector of a third transistor having a conductive type reverse so that of the second transistor and the base is connected to a third terminal at constant voltage;

the emitter of the third transistor is connected to a fourth terminal at constant voltage and the base is connected to a fifth terminal at constant voltage;

the emitter of a fourth transistor is connected to the emitter of the second transistor and the collector is connected to the fourth terminal at constant voltage;

the emitter of the first transistor is connected to the emitter of the second transistor via a capacitor;

the collector of the second transistor is connected to the base of the first transistor; and the base of the first transistor functions as the input terminal of the variable negative capacitor and the base of the fourth transistor functions as a negative capacitance value control terminal.

10. An optical receiver according to claim 1, wherein:

in said variable negative capacitor, connection is made as follows;

the source of a first field-effect transistor is connected to a first terminal at constant voltage via a first constant current source or a first resistor and the drain is connected to a second terminal at constant voltage;

the source of a second field-effect transistor is connected to the first terminal at constant voltage via a second constant current source or a second resistor, the drain is connected to a third terminal at constant voltage via a third constant current source or a third resistor and the gate is connected to a fourth terminal at constant voltage;

the source of the first field-effect transistor is connected to the source of the second field-effect transistor via a capacitor;

the source of a third field-effect transistor is connected to the source of the second field-effect transistor and the drain is connected to the third terminal at constant voltage;

the drain of the second field-effect transistor is connected to the gate of the first field-effect transistor; and the gate of the first field-effect transistor functions as the input terminal of the variable negative capacitor and the gate of the third field-effect transistor functions as a negative capacitance value control terminal.

11. An optical receiver according to claim 1, wherein:

in said variable negative capacitor, connection is made as follows;

the source of a first field-effect transistor is connected to a first terminal at constant voltage via a first constant current source or a first resistor and the drain is connected to a second terminal at constant voltage;

the source of a second field-effect transistor is connected to the first terminal at constant voltage via a second constant current source or a second resistor, the drain is connected to the drain of a third field-effect transistor having a conductive type reverse to that of the second field-effect transistor and the gate is connected to a third terminal at constant voltage;

the source of the third field-effect transistor is connected to a fourth terminal at constant voltage and the gate is connected to a fifth terminal at constant voltage;

the source of a fourth field-effect transistor is connected to the source of the second field-effect transistor and the drain is connected to the fourth terminal at constant voltage;

the source of the first field-effect transistor is connected to the source of the second field-effect transistor via a capacitor;

the drain of the second field-effect transistor is connected to the gate of the first field-effect transistor; and the gate of the first field-effect transistor functions as the input terminal of the variable negative capacitor and the gate of the fourth field-effect transistor functions as a negative capacitance value control terminal.

12. An optical receiver according to claim 1, wherein:

in said variable negative capacitor, connection is made as follows;

the emitter of a first transistor is connected to a first terminal at constant voltage via a first constant current source or a first resistor and the collector is connected to a second terminal at constant voltage via a second resistor;

the emitter of a second transistor is connected to the emitter of the first transistor, the collector is connected to a second terminal at constant voltage via a third resistor and the base is connected to a third terminal at constant voltage;

the base of a third transistor is connected to the collector of the second transistor;

the emitter of the third transistor is connected to a fourth terminal at constant voltage via a second constant current source or a fourth resistor and the collector is connected to a fifth terminal at constant voltage;

the emitter of a fourth transistor is connected to the fourth terminal at constant voltage via a third constant current source or a fifth resistor, the collector is connected to a sixth terminal at constant voltage via a fourth constant current source or a sixth resistor and the base is connected to a seventh terminal at constant voltage;

the emitter of the third transistor is connected to the emitter of the fourth transistor via a capacitor;

the emitter of a fifth transistor is connected to the emitter of the fourth transistor and the collector is connected to the sixth terminal at constant voltage;

the collector of the fourth transistor is connected to the base of the first transistor; and the base of the first transistor functions as the input terminal of the variable negative capacitor and the base of the fourth transistor functions as a negative capacitance value control terminal.

13. An optical receiver according to claim 1, wherein:

in said variable negative capacitor, connection is made as follows;

the source of a first field-effect transistor is connected to a first terminal at constant voltage via a first constant current source or a first resistor and the drain is connected to the drain of a second field-effect transistor having a conductive type reverse to that of the first field-effect transistor;

the source of a third field-effect transistor is connected to the source of the first field-effect transistor and the drain is connected to the drain of a fourth field-effect transistor having a conductive type reverse to that of the third field-effect transistor;

the gate and the drain of the second field-effect transistor are connected to the gate of the fourth field-effect transistor;

each source of the second field-effect transistor and the fourth field-effect transistor is connected to a second terminal at constant voltage;

the gate of the third field-effect transistor is connected to a third terminal at constant voltage;

the gate of a fifth field-effect transistor is connected to the drain of the third field-effect transistor, the source is connected to a fourth terminal at constant voltage via a second constant current source or a second resistor and the drain is connected to a fifth terminal at constant voltage;

the source of a sixth field-effect transistor is connected to the fourth terminal at constant voltage via a third constant current source or a third resistor, the drain is connected to a sixth terminal at constant voltage via a fourth constant current source or a fourth resistor and the gate is connected to a seventh terminal at constant voltage;

the source of the fifth field-effect transistor is connected to the source of the sixth field-effect transistor via a capacitor;

the source of a seventh field-effect transistor is connected to the source of the sixth field-effect transistor and the drain is connected to the sixth terminal at constant voltage;

the drain of the sixth field-effect transistor is connected to the gate of the first field-effect transistor; and the gate of the first field-effect transistor functions as the input terminal of the variable negative capacitor and the gate of the seventh field-effect transistor functions as a negative capacitance value control terminal.

14. An optical receiver according to claim 1, wherein:

the negative capacitance value of said variable negative capacitor is regulated based upon voltage applied to a negative capacitance value control terminal thereof so that the frequency characteristic of the optical receiver is flat.

15. An optical receiver according to claim 1, wherein:

the negative capacitance value of said variable negative capacitor is regulated based upon voltage applied to a negative capacitance value control terminal thereof so that bandwidth of the optical receiver has an arbitrary value.

16. An optical receiver according to claim 1, wherein:

the negative capacitance value of said variable negative capacitor is regulated based upon voltage applied to a negative capacitance value control terminal thereof so that a variance of the frequency characteristic of said optical receiver caused by dispersion at manufacturing can be compensated.

17. An optical receiver according to claim 1, wherein:

the ratio of the inverse number of the time constant of the input terminal of the preamplifier and the inverse number of the time constant of the collector of a first transistor of the preamplifier is a value at which the frequency characteristic of the optical receiver is flat.

18. An optical receiver according to claim 1, wherein:

the ratio of the inverse number of the time constant of the input terminal of the preamplifier and the inverse number of the time constant of the collector of a first transistor of the preamplifier is equivalent to an arbitrary value of bandwidth in which the gain of the preamplifier is dependent upon a frequency.

19. An optical receiver according to claim 1, wherein:

the ratio of the inverse number of the time constant of the input terminal of a preamplifier and the inverse number of the time constant of the collector of a first transistor of the preamplifier is regulated so that a variance of the frequency characteristic of said optical receiver caused by dispersion at manufacturing can be compensated.

* * * * *